US010090161B2

(12) United States Patent
Doba et al.

(10) Patent No.: US 10,090,161 B2
(45) Date of Patent: Oct. 2, 2018

(54) PLASMA ETCHING APPARATUS AND PLASMA ETCHING METHOD

(71) Applicant: Tokyo Electron Limited, Tokyo (JP)

(72) Inventors: Shigeki Doba, Miyagi (JP); Satoshi Yamada, Miyagi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 15/404,471

(22) Filed: Jan. 12, 2017

(65) Prior Publication Data

US 2017/0133234 A1 May 11, 2017

Related U.S. Application Data

(62) Division of application No. 14/007,695, filed as application No. PCT/JP2012/058244 on Mar. 28, 2012, now abandoned.

(30) Foreign Application Priority Data

Mar. 29, 2011 (JP) ................................ 2011-073191

(51) Int. Cl.
*H01L 21/3065* (2006.01)
*H01J 37/32* (2006.01)
(Continued)

(52) U.S. Cl.
CPC .... *H01L 21/3065* (2013.01); *H01J 37/32082* (2013.01); *H01J 37/32091* (2013.01);
(Continued)

(58) Field of Classification Search
CPC ........... H01L 21/3065; H01L 21/68735; H01L 21/76898; H01L 21/31138;
(Continued)

(56) References Cited

U.S. PATENT DOCUMENTS 5,779,803 A 7/1998 Kurono et al.
6,503,331 B1 1/2003 Yudovsky et al.
(Continued)

FOREIGN PATENT DOCUMENTS

JP 2000-331913 11/2000
JP 2006-049461 2/2006
(Continued)

*Primary Examiner* — Anita K Alanko
(74) *Attorney, Agent, or Firm* — IPUSA, PLLC

(57) ABSTRACT

A plasma etching apparatus performs plasma etching on a substrate having a resist pattern formed thereon and an outer edge portion where the substrate surface is exposed. The plasma etching apparatus includes a support part that supports the substrate, a cover member that covers the outer edge portion of the substrate and prevents plasma from coming around the outer edge portion, and a control unit that generates plasma by controlling high frequency power application and supply of a processing gas for etching, and uses the generated plasma to etch the substrate that is supported by the support part and has the outer edge portion covered by the cover member. After etching the substrate, the control unit generates plasma by controlling high frequency power application and supply of a processing gas for ashing, and uses the generated plasma to perform ashing on the resist pattern on the etched substrate.

7 Claims, 17 Drawing Sheets

(51) Int. Cl.
*H01L 21/687* (2006.01)
*H01L 21/768* (2006.01)
*H01L 21/311* (2006.01)

(52) U.S. Cl.
CPC .. *H01J 37/32165* (2013.01); *H01J 37/32651* (2013.01); *H01J 37/32715* (2013.01); *H01L 21/31138* (2013.01); *H01L 21/68735* (2013.01); *H01L 21/76898* (2013.01); *H01J 2237/334* (2013.01)

(58) Field of Classification Search
CPC ........... H01J 37/32082; H01J 37/32715; H01J 37/32165; H01J 37/32091; H01J 37/32651; H01J 2237/334
See application file for complete search history.

(56) References Cited

U.S. PATENT DOCUMENTS 6,511,543 B1* 1/2003 Stauss ............... H01L 21/68721 118/500
6,589,352 B1 7/2003 Yudovsky et al.
6,676,759 B1 1/2004 Takagi
6,773,562 B1 8/2004 Inagawa et al.
8,048,768 B2* 11/2011 Yamada .............. B32B 37/1292 156/273.3
2004/0139917 A1 7/2004 Yamaguchi et al.
2005/0173065 A1 8/2005 Arita
2005/0269292 A1 12/2005 Koshiishi et al.
2007/0059933 A1* 3/2007 Tahara .................... G03F 7/427 438/689
2011/0198721 A1* 8/2011 Yang ................ H01L 21/76898 257/506
2011/0266257 A1 11/2011 Nishizuka et al.
2014/0021631 A1* 1/2014 Tsumura ........... H01L 23/49827 257/774

FOREIGN PATENT DOCUMENTS

JP 2006049461 A * 2/2006
JP 2007-220815 8/2007
JP 2009-295636 12/2009
JP 2010-192488 9/2010
WO 2010/055862 5/2010

* cited by examiner 52
52a
51a
51
52b
51b
51c
51d
53
6c
DI
DO
W
6d
61
WE
6
5

| | | DISTANCE FROM WAFER CENTER (mm) | | |
|---|---|---|---|---|
| MATERIAL | INNER DIAMETER (mm) | 145 | 147 | 148 |
| QUARTZ | 296.6 | 90 | 88.6 | 83.3 |
| YTTRIA ($Y_2O_3$) | 296.6 | 90 | 89.5 | 83.8 |
| YTTRIA ($Y_2O_3$) | 298 | 90 | 90 | 86.5 |

PLASMA ETCHING APPARATUS AND PLASMA ETCHING METHOD

CROSS-REFERENCE TO RELATED APPLICATION

The present application is a divisional application and claims priority under 35 U.S.C. 120 to U.S. patent application Ser. No. 14/007,695, filed on Sep. 26, 2013, which is the National Stage of International Application No. PCT/JP2012/058244, filed on Mar. 28, 2012, which claims priority under 35 U.S.C. 119 to Japanese Patent Application No. 2011-073191, filed on Mar. 29, 2011. The entire contents of the foregoing applications are incorporated herein by reference.

TECHNICAL FIELD

The present invention relates to a plasma etching apparatus and a plasma etching method.

BACKGROUND ART

In the field of semiconductor device manufacturing, numerous efforts have been made to increase the density of semiconductor devices through their miniaturization. Recently, attention is being directed to a semiconductor device stacking technique called three-dimensional (3D) packaging as means for increasing the density per unit area of semiconductor devices.

Semiconductor devices stacked in the vertical direction may include electrodes that are arranged to penetrate through a substrate made of silicon, for example. In this way, the semiconductor devices may be electrically connected via the electrodes. To create such an electrode that penetrates through a substrate, a resist is applied on the substrate using a coater, the resist is exposed using an exposure apparatus, and a resist pattern is developed using a developing apparatus. The resist is then used as a mask to etch the substrate using a plasma etching apparatus to create a through hole or a via hole. After creating the through hole or via hole in the substrate, the resist remaining on the substrate is removed by ashing.

When etching the substrate using the plasma etching apparatus in the above process, if the resist applied on the substrate extends to the outer edge portion of the substrate, the resist may come into contact with a substrate carrier or a transfer arm and come off during transfer of the substrate, and this may result in the generation of dust. Accordingly, after applying the resist on the substrate, the resist is removed from the rear surface and the outer edge portion including a bevel portion of the substrate by a back rinse mechanism and a bevel rinse mechanism of the coater using an organic solvent, for example. In this way, dust may be prevented from being generated as a result of the resist coming off of the outer edge portion of the substrate (See e.g., Patent Document 1).

As another way of preventing the generation of dust as a result of the resist material coming off of the outer edge portion of a substrate, after applying the resist on the substrate and exposing the entire substrate to form a resist pattern, an insolubilization process may be performed on the resist pattern formed at the outer edge portion of the substrate using a developing solution (See e.g., Patent Document 2).

PRIOR ART DOCUMENTS

Patent Documents

Patent Document 1: Japanese Laid-Open Patent Publication No. 2009-295636

Patent Document 2: Japanese Laid-Open Patent Publication No. 2000-331913

SUMMARY OF THE INVENTION

Problem to be Solved by the Invention

However, in the above case where the resist on the outer edge portion of a substrate is removed after which the substrate is etched using the resist pattern on the substrate as a mask and the remaining resist is removed by asking, the following problems are encountered, for example.

When etching the substrate using a plasma etching apparatus, because the substrate surface of a bevel region of the substrate is exposed, the exposed substrate surface may be prone to build-up of black silicon, which refers to the roughening of the silicon substrate surface due to exposure to plasma. For example, when a part of the resist applied on the surface of the substrate is removed from a region extending over a predetermined width from the outer edge of the substrate, black silicon may be formed at both the substrate surface and rear surface within this region.

To prevent the formation of black silicon, the region extending over a predetermined width from the outer edge of the substrate may be protected by a resist as illustrated in Patent Documents 1 and 2, for example. However, as described above, when the region extending over the predetermined width from the outer edge of the substrate is protected by a resist, the resist may come off during transfer of the substrate to result in the generation of dust, for example.

Also, the above problem is not limited to cases of etching one substrate. For example, in the case of etching a bonded substrate that is formed by bonding a plurality of substrates via an adhesive, the adhesive is exposed at the outer edge portion of the bonded substrate. Thus, the exposed adhesive may come off upon coming into contact with plasma to cause the generation of dust, or the substrates themselves may be separated from one another. Further, the outer edge portion of the bonded substrate may become brittle or be prone to cracking, for example.

The present invention has been conceived in view of the foregoing problems associated with the prior art, and it is an object of the present invention to provide a plasma etching apparatus and a plasma etching method that are capable of protecting the outer edge portion of a substrate having a resist pattern formed thereon upon etching the substrate.

Means for Solving the Problem

According to one embodiment of the present invention, a plasma etching apparatus is provided that performs plasma etching on a substrate having a surface portion on which a resist pattern is formed and an outer edge portion where a substrate surface of the substrate is exposed. The plasma etching apparatus includes a support part that supports the substrate; a cover member that covers the outer edge portion of the substrate that is supported by the support part and prevents plasma from coming around the outer edge portion of the substrate; and a control unit that generates plasma by controlling application of a high frequency power from a high frequency power supply and supply of a processing gas for etching from a first processing gas supply source, and uses the generated plasma to etch the substrate that is supported by the support part and has the outer edge portion covered by the cover member. After etching the substrate, the control unit generates plasma by controlling application of a high frequency power from a high frequency power supply and supply of a processing gas for ashing from a second processing gas supply source, and uses the generated plasma to perform ashing on the resist pattern on the etched substrate.

According to another embodiment of the present invention, a plasma etching apparatus is provided that performs plasma etching on a bonded substrate, which includes a plurality of substrates that are bonded together via an adhesive, the bonded substrate having a surface portion on which a resist pattern is formed and an outer edge portion where the adhesive is exposed. The plasma etching apparatus includes a support part that supports the bonded substrate; a cover member that covers the outer edge portion of the bonded substrate that is supported by the support part and prevents plasma from coming around the outer edge portion of the bonded substrate; and a control unit that generates plasma by controlling application of a high frequency power from a high frequency power supply and supply of a processing gas for etching from a first processing gas supply source, and uses the generated plasma to etch the bonded substrate that is supported by the support part and has the outer edge portion covered by the cover member. After etching the bonded substrate, the control unit generates plasma by controlling application of a high frequency power from a high frequency power supply and supply of a processing gas for ashing from a second processing gas supply source, and uses the generated plasma to perform ashing on the resist pattern on the etched bonded substrate.

According to another embodiment of the present invention, a plasma etching method is provided for performing plasma etching on a substrate having a surface portion on which a resist pattern is formed and an outer edge portion where a substrate surface of the substrate is exposed. The plasma etching method includes the steps of supporting the substrate by a support part; arranging a cover member to cover the outer edge portion of the substrate that is supported by the support part to prevent plasma from coming around the outer edge portion of the substrate; generating plasma by controlling application of a high frequency power from a high frequency power supply and controlling supply of a processing gas for etching from a first processing gas supply source, and using the generated plasma to etch the substrate that is supported by the support part and has the outer edge portion covered by the cover member; and after etching the substrate, generating plasma by controlling application of a high frequency power from a high frequency power supply and controlling supply of a processing gas for ashing from a second processing gas supply source, and using the generated plasma to perform ashing on the resist pattern on the etched substrate.

According to another embodiment of the present invention, a plasma etching method is provided for performing plasma etching on a bonded substrate, which includes a plurality of substrates that are bonded together via an adhesive, the bonded substrate having a surface portion on which a resist pattern is formed and an outer edge portion where the adhesive is exposed. The plasma etching method includes the steps of supporting the bonded substrate by a support part; arranging a cover member to cover the outer edge portion of the bonded substrate that is supported by the support part to prevent plasma from coming around the outer edge portion of the bonded substrate; generating plasma by controlling application of a high frequency power from a high frequency power supply and controlling supply of a processing gas for etching from a first processing gas supply source, and using the generated plasma to etch the bonded substrate that is supported by the support part and has the outer edge portion covered by the cover member; and after etching the bonded substrate, generating plasma by controlling application of a high frequency power from a high frequency power supply and controlling supply of a processing gas for ashing from a second processing gas supply source, and using the generated plasma to perform ashing on the resist pattern on the etched bonded substrate.

Advantageous Effect of the Invention

According to an aspect of the present invention, when etching a substrate having a resist pattern formed thereon, an outer edge portion of the substrate may be protected.

BRIEF DESCRIPTION OF THE DRAWINGS

FIG. 16 is a table indicating measurement results of the angles of via holes with respect to the horizontal direction for via holes formed at various distances from the center of the wafer.

EMBODIMENTS FOR IMPLEMENTING THE INVENTION

In the following, embodiments of the present invention are described with reference to the accompanying drawings.

First Embodiment

First, a plasma etching apparatus according to a first embodiment of the present invention is described.

Figure 1:
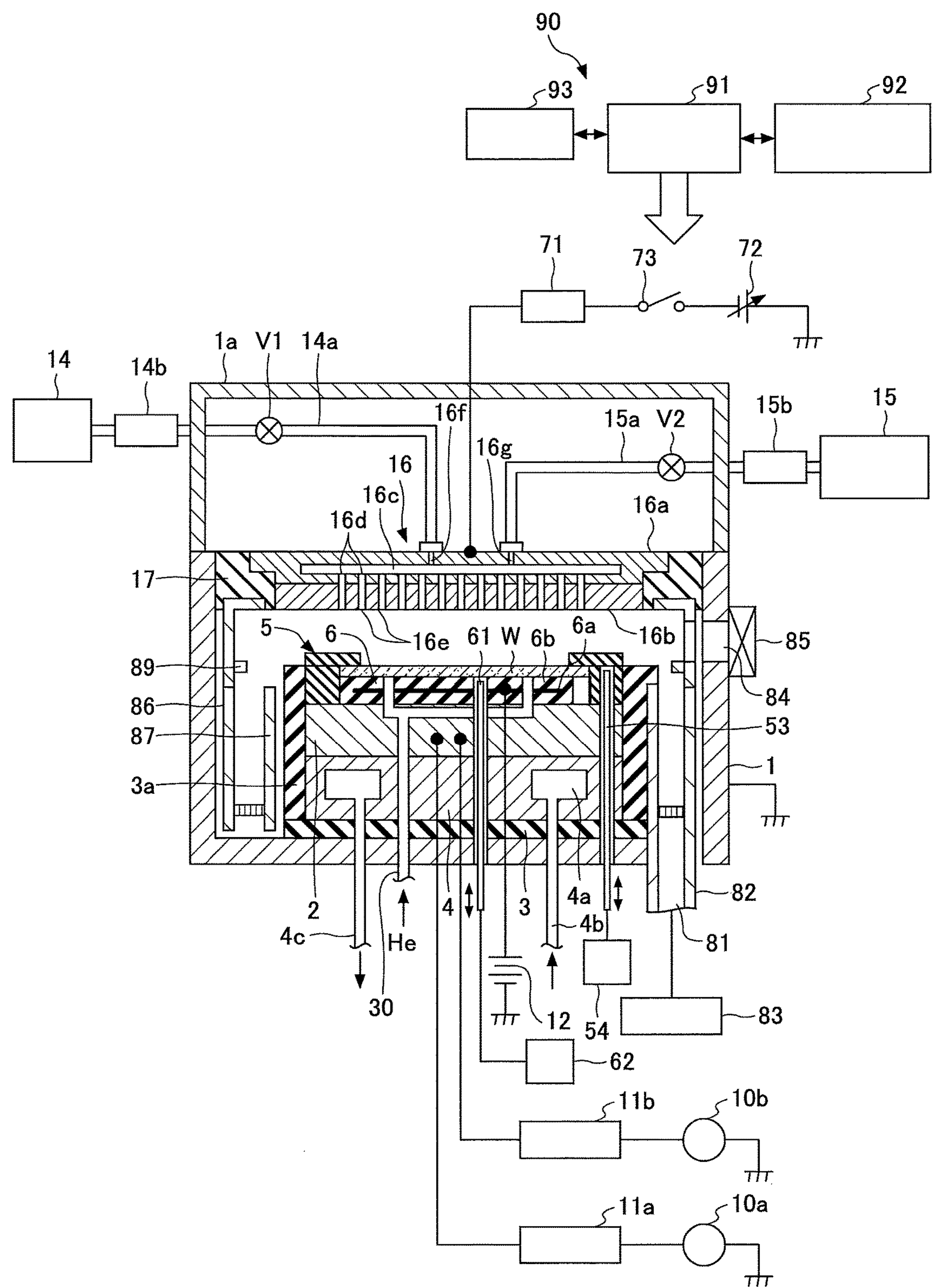
FIG. 1 is a schematic cross-sectional view illustrating a configuration of a plasma etching apparatus according to a first embodiment of the present invention.

FIG. 1 is a schematic cross-sectional view illustrating a configuration of the plasma etching apparatus according to the first embodiment of the present invention.

The plasma etching apparatus includes a processing chamber 1 that is configured to be airtight and is electrically grounded. The processing chamber 1 has a cylindrical structure and may be made of aluminum, for example. A stage 2 that holds a semiconductor wafer W (simply referred to as "wafer W" hereinafter) in the horizontal direction is arranged inside the processing chamber 1. The wafer W is an example of a substrate to be processed. The stage 2 may be made of aluminum, for example, and is configured to act as a lower electrode. The stage 2 is supported by a conductor support 4 and is arranged at a bottom of the processing chamber 1 via an insulating plate 3. A cylindrical inner wall member 3*a* that may be made of quartz, for example, is arranged to surround the stage 2 and the support 4.

A bevel cover ring 5 is arranged on an upper side outer edge portion of the stage 2. The configuration of the bevel cover ring 5 is described in detail below. The bevel cover ring 5 is an embodiment of a cover member that prevents plasma from coming around the outer edge portion of a substrate.

A first RF power supply 10*a* is connected to the stage 2 via a first matching unit 11*a*, and a second RF power supply 10*b* is connected to the stage 2 via a second matching unit 11*b*. The first RF power supply 10*a* is for plasma generation. The first RF power supply 10*a* is configured to output to the stage 2 a high frequency power of a predetermined frequency (at least 27 MHz; e.g., 100 MHz). The second RF power supply 10*b* is for ion attraction. The second RF power supply 10*b* is configured to output to the stage 2 a high frequency power of a predetermined frequency (no more than 13.56 MHz; e.g., 13.56 MHz) that is lower than the high frequency power output by the first RF power supply 10*a*. A shower head 16 that acts as an upper electrode is arranged above the stage 2 to face the stage 2 in parallel. The shower head 16 and the stage 2 are configured to function as a pair of electrodes (i.e., upper electrode and lower electrode).

In the processing chamber 1, plasma is generated from a processing gas for etching that is introduced from the shower head 16, which acts as the upper electrode, using the high frequency power applied to the stage 2, which acts as the lower electrode. The generated plasma is used to perform an etching process on the wafer W that has its outer edge portion covered by the cover member (bevel cover ring 5). After the etching process, plasma is generated from a processing gas for ashing that is introduced into the processing chamber 1 by the high frequency power applied to the lower electrode, and the generated plasma is used to perform an ashing process on the wafer W that has its outer edge portion covered by the cover member. The above processes are controlled by a control unit 90.

An electrostatic chuck 6 that is configured to hold the wafer W by an electrostatic attracting force is provided on a top surface of the stage 2. The electrostatic chuck 6 includes an electrode 6*a* arranged within an insulator 6*b*. The electrode 6*a* is electrically connected to a DC power supply 12. A Coulomb force is generated between the electrode 6*a* and the wafer W by the application of a DC voltage from the DC power supply 12 so that the wafer W may be electrostatically attracted to the electrostatic chuck 6 by the Coulomb force. In this way, the wafer W is held by the electrostatic chuck 6.

In the present example, the stage 2 and the electrostatic chuck 6 embody a support part that supports a substrate.

A coolant path 4*a* is formed within the support 4, and the coolant path 4*a* is connected to a coolant inlet pipeline 4*b* and a coolant outlet pipeline 4*c*. By circulating a suitable coolant such as cooling water through the coolant path 4*a*, the support 4 and the stage 2 may be controlled to a predetermined temperature. Further, a rear side gas supply line 30 for supplying a heat transfer gas (rear side gas) such as a helium (He) gas to a rear surface of the wafer W is arranged to penetrate through the stage 2, for example. The rear side gas supply line 30 is connected to a rear side gas supply source (not shown). With such an arrangement, the wafer W that is electrostatically attracted to the top surface of the stage 2 by the electrostatic chuck 6 may be controlled to a predetermined temperature.

The shower head 16 is arranged at a ceiling portion of the processing chamber 1. The shower head 16 includes a main body 16*a* and an upper ceiling plate 16*b*, which acts as an electrode plate. The shower head 16 is mounted to a top part of the processing chamber 1 via an insulating member 17. The main body 16*a* may be made of a conductive material such as aluminum having a surface that is alumite-treated, for example. The upper ceiling plate 16*b* is detachably mounted to a lower part of the main body 16*a*.

The main body 16*a* has a gas diffusion chamber 16*c* arranged therein. Multiple gas through holes 16*d* that communicate with the gas diffusion chamber 16*c* are arranged at a bottom part of the main body 16*a*. Also, gas introduction holes 16*e* that communicate with the gas through holes 16*d* are arranged to penetrate through the upper ceiling plate 16*b* in its thickness direction. With such an arrangement, a processing gas supplied to the gas diffusion chamber 16*c* may be dispersed via the gas through holes 16*d* and the gas introduction holes 16*e* upon being supplied to the processing chamber 1. Further, a pipeline (not shown) for circulating a coolant is arranged within the main body 16*a* so that the shower head 16 may be cooled to a predetermined temperature while a plasma etching process is performed.

The main body 16*a* has a gas introduction port 16*f* for introducing processing gas for etching into the gas diffusion chamber 16*c*. The gas introduction port 16*f* is connected to one end of a gas supply pipeline 14*a*. The other end of the gas supply pipeline 14*a* is connected to a first processing gas supply source 14 for supplying the processing gas for etching. A mass flow controller (MFC) 14*b* and an open/close valve V1 are arranged on the gas supply line 14*a* in this order from the upstream side. Processing gas for plasma etching is introduced into the gas diffusion chamber 16*c* from the first processing gas supply source 14 via the gas supply pipeline 14*a*. The processing gas is then discharged from the gas diffusion chamber 16*c* through the gas through holes 16*d* and the gas introduction holes 16*e* to be dispersed into the processing chamber 1 like a shower.

The main body 16*a* also has a gas introduction port 16*g* for introducing processing gas for ashing into the gas diffusion chamber 16*c*. The gas introduction port 16*g* is connected to one end of a gas supply pipeline 15*a*. The other end of the gas supply pipeline 15*a* is connected to a second processing gas supply source 15 that supplies a processing gas for ashing. A mass flow controller (MFC) 15*b* and an open/close valve V2 are arranged on the gas supply line 15*a* in this order from the upstream side. Processing gas for plasma ashing is introduced into the gas diffusion chamber 16*c* from the second processing gas supply source 15 via the gas supply pipeline 15*a*. The processing gas is then discharged from the gas diffusion chamber 16*c* through the gas through holes 16*d* and the gas introduction holes 16*e* to be dispersed into the processing chamber 1 like a shower.

The shower head 16, which acts as the upper electrode as described above, is electrically connected to a low pass filter (LPF) 71 via a variable DC power supply 72. Power supply operations of the variable DC power supply 72 may be turned on/off by an on/off switch 73. The current voltage of the variable DC power supply 72 and the on/off operations of the on/off switch 73 are controlled by the control unit 90 (described below). As described in detail below, when generating plasma within the processing chamber 1 by applying a high frequency power from the first RF power supply 10*a* or the second RF power supply 10*b* to the stage 2, the control unit 90 turns on the on/off switch 73 as is necessary so that a predetermined DC voltage may be applied to the shower head 16, which acts as the upper electrode.

Further, a cylindrically-shaped ground conductor 1*a* is arranged to extend above the height of the shower head 16 from the side wall of the processing chamber 1. The cylindrically-shaped ground conductor 1*a* has a ceiling wall arranged at its top portion.

An exhaust port 81 is formed at a bottom portion of the processing chamber 1, and an exhaust device 83 is connected to the exhaust port 81 via an exhaust pipe 82. The exhaust device 83 includes a vacuum pump, and the pressure within the processing chamber 1 may be reduced to a predetermined degree of vacuum by operating this vacuum pump. Further, a loading/unloading port 84 is arranged at the side wall of the processing chamber 1, and a gate valve 85, which is configured to open and close the loading/unloading port 84, is arranged at the loading/unloading port 84.

Further, deposition shields 86 and 87, which are configured to be detachable, are arranged within the processing chamber 1. The deposition shield 86 is arranged along the inner wall face of the processing chamber 1 and is configured to prevent etching by-products (deposition) from adhering to the processing chamber 1. A conductive member (GND block) 89 is connected to the deposition shield 86 at a height position that is substantially the same as that of the wafer W. The conductive member (GND block) 89 is connected such that its potential with respect to ground may be controlled, and in this way, an abnormal discharge may be prevented.

In the following, the configuration of the bevel cover ring 5 is described in detail.

Figure 2:
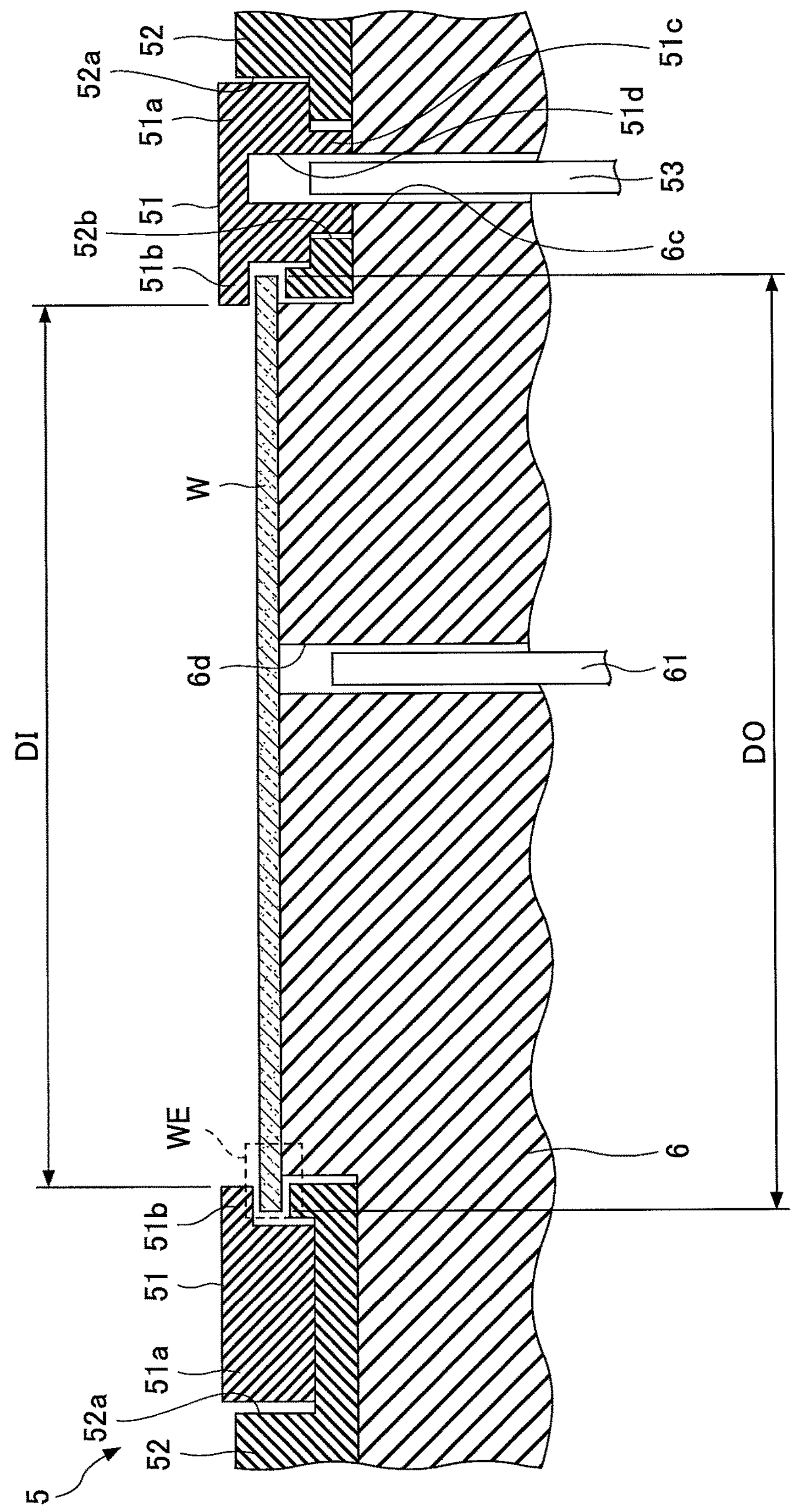
FIG. 2 is an enlarged cross-sectional view of a portion surrounding a bevel cover ring.

FIG. 2 is an enlarged schematic cross-sectional view of a portion surrounding the bevel cover ring 5.

As illustrated in FIGS. 1 and 2, the bevel cover ring 5 includes an upper ring member 51, a lower ring member 52, a lift pin 53, and a drive mechanism 54.

The upper ring member 51 includes a main part 51*a* and a brim part 51*b*. The main part 51*a* has a ring-shaped structure. The brim part 51*b* is arranged to protrude inward from the inner circumference of the main part 51*a* in the radial direction of the ring-shaped main part 51*a*. The brim part 51*b* is configured to cover an outer edge portion WE of the wafer W that is held by the electrostatic chuck 6. The upper ring member 51 includes the brim part 51*b* that covers the outer edge portion WE in order to prevent plasma from coming around the outer edge portion WE of the wafer W.

The upper ring member 51 may be made of quartz or yttria ($Y_2O_3$), for example. Yttria may be preferred considering its excellent plasma resistance. Also, as described in detail below with reference to FIG. 16, in terms of suppressing the inclination angle of a via hole V, yttrium may produce effects that are substantially the same or even more advantageous than that in a case where quartz is used.

The lower ring member 52 is arranged into a ring-shaped structure corresponding to the ring-shape of the upper ring member 51. A ring-shaped groove 52*a* is formed at the upper face of the lower ring member 52. By having the main part 51*a* engage the ring-shaped groove 52*b* formed on the upper face of the lower ring member 52, movement of the upper ring member 51 in the horizontal direction may be restricted.

Multiple (e.g., three) through holes 52*b* penetrating through the lower ring member 52 in the vertical direction are formed along the circumferential direction of the lower ring member 52. Protrusions 51*c* are formed along the circumferential direction of the upper ring member 51 at positions corresponding to the through holes 52*b*. By having the protrusions 51*c* of the upper ring member 51 engage the through holes 52*b* famed at the lower ring member 52, movement of the upper ring member 51 in the circumferential direction may be restricted. The lower ring member 52 may be made of quartz, for example.

Further, holes 51*d* are formed at the bottom faces of the protrusions 51*c* of the upper ring member 51.

The lift pin 53 is arranged within a hole 6*c* formed at the electrostatic chuck 6 at a position corresponding to that of the hole 51*d*, which is formed at the upper ring member 51. The lift pin 53 is configured to be movable in the vertical direction by the drive mechanism 54 that drives the lift pin 53 to move up and down. When the lift pin 53 is raised, the top end of the left pin 53 pushes an upper face of the hole 51*d* of the upper ring member 51 in the upward direction so that the upper ring member 51 may be raised.

The electrostatic chuck 6 includes a lift pin 61 and a drive mechanism 62. The lift pin 61 is arranged within a hole 6*d* formed at the electrostatic chuck 6 and is configured to be movable in the vertical direction by the drive mechanism 62 that drives the lift pin 61 to move up and down. When the lift pin 61 is raised, the top end of the left pin 61 pushes the wafer W upward so that the wafer W may be raised.

The overall operations of the plasma etching device having the above configuration are controlled by the control unit 90. The control unit 90 includes a process controller 91, a user interface 92, and a storage unit 93. The process controller 91 includes a CPU and is configured to control operations of various components of the plasma etching device.

The user interface 92 may include a keyboard that is operated by a process controller to input various commands for controlling the process of the plasma etching apparatus, and a display that indicates the operation status of the plasma etching apparatus in visual form, for example.

The storage unit 93 stores recipes that include control programs (software) for enabling the process controller 91 to control various process operations of the plasma etching apparatus and process condition data, for example. The process controller 91 reads a given recipe from the storage unit 93 according to a command from the user interface 92 to execute a desired process. In this way, the plasma etching apparatus may perform the desired process under control by the control processor 91. In certain embodiments, the recipes including the control programs and process condition data may be stored in a computer-readable storage medium (e.g., hard disk, CD, flexible disk, semiconductor memory). In other embodiments, the recipes including the control programs and process condition data may be transmitted from another device via a dedicated line, for example.

In the following, a plasma etching method according to an embodiment of the present invention is described.

FIGS. 3-6 are schematic cross-sectional views illustrating various states of an operation for placing the wafer W on the electrostatic chuck 6.

Figure 3:
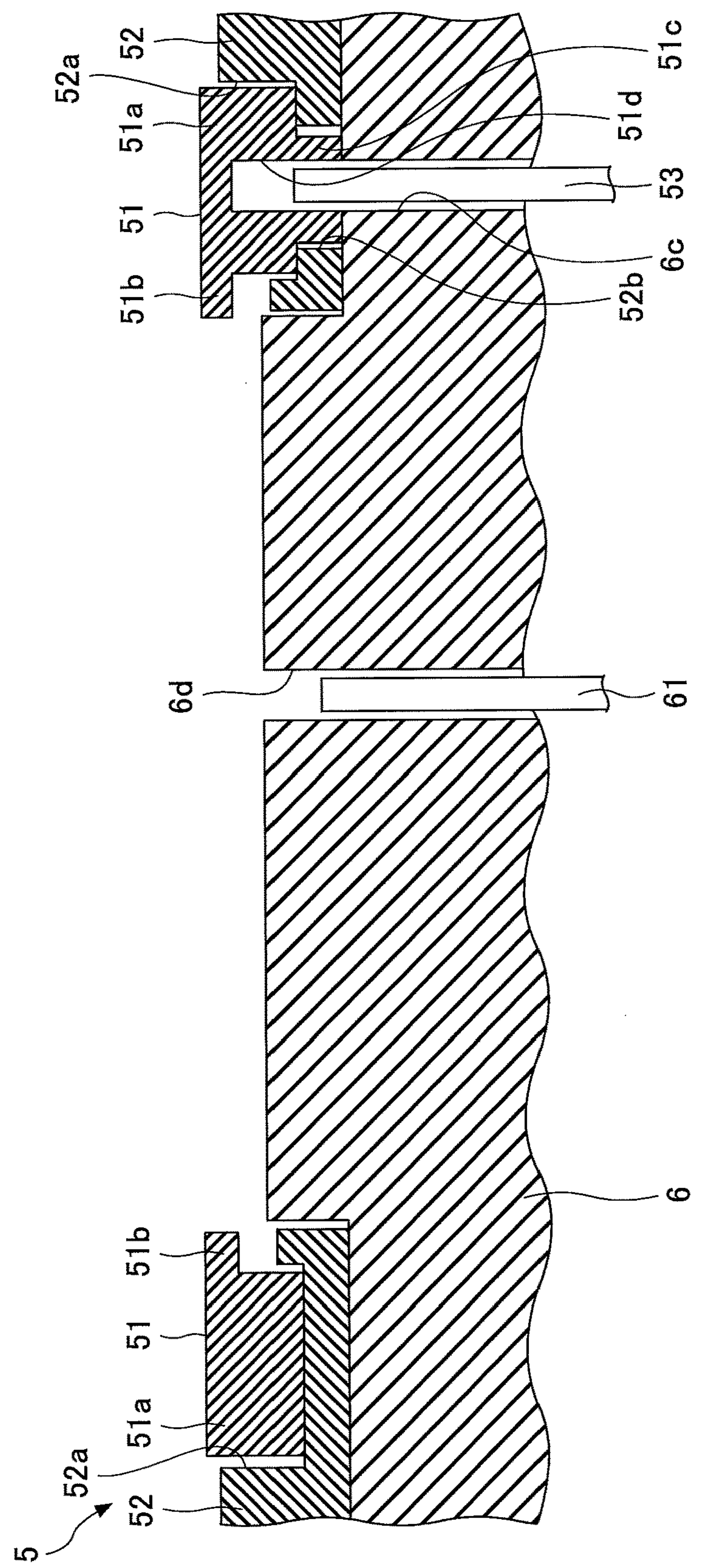
FIG. 3 is a schematic cross-sectional view illustrating a first state of an operation for placing a wafer on an electrostatic chuck.
Figure 4:
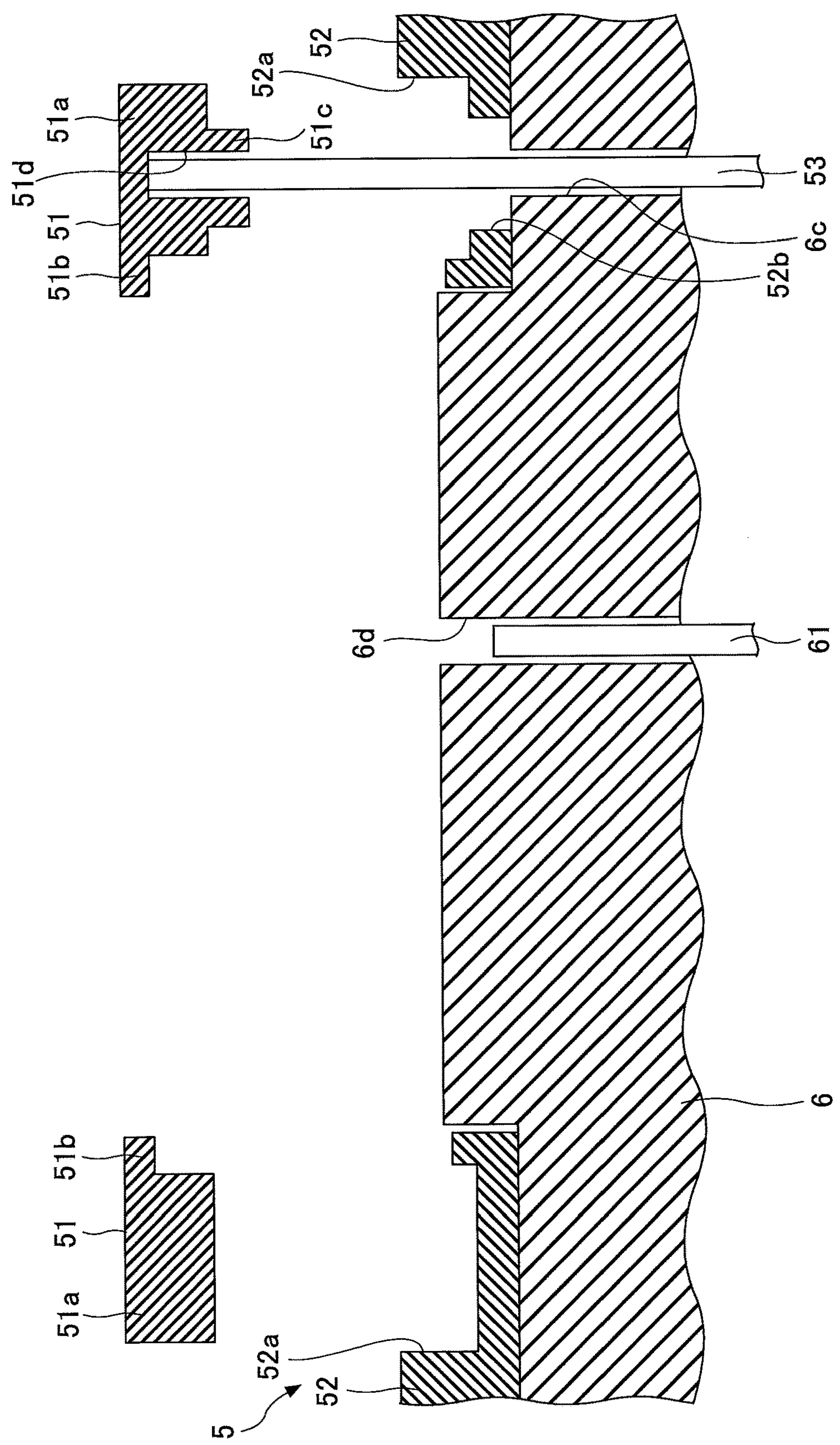
FIG. 4 is a schematic cross-sectional view illustrating a second state of the operation for placing the wafer on the electrostatic chuck.
Figure 5:
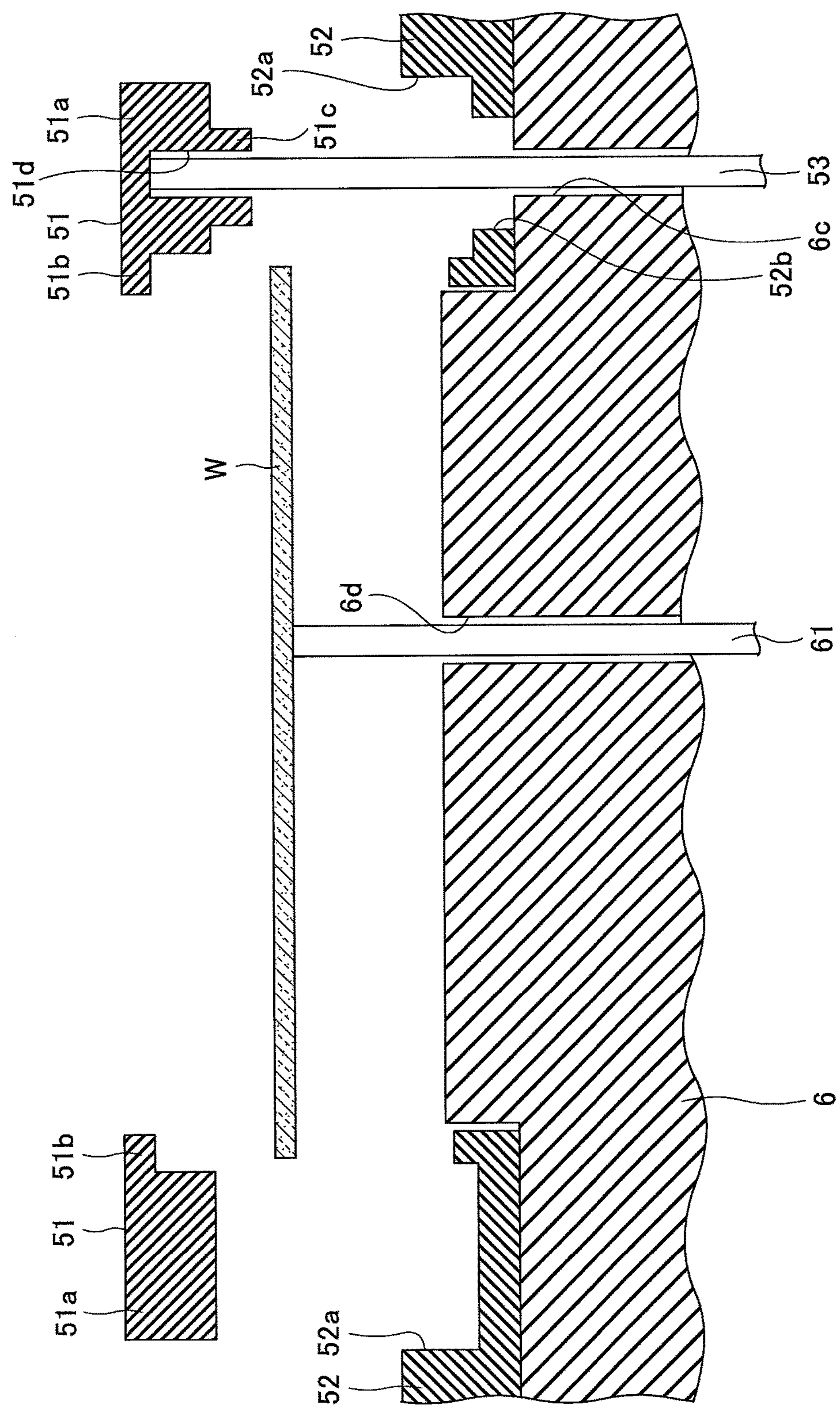
FIG. 5 is a schematic cross-sectional view illustrating a third state of the operation for placing the wafer on the electrostatic chuck.
Figure 6:
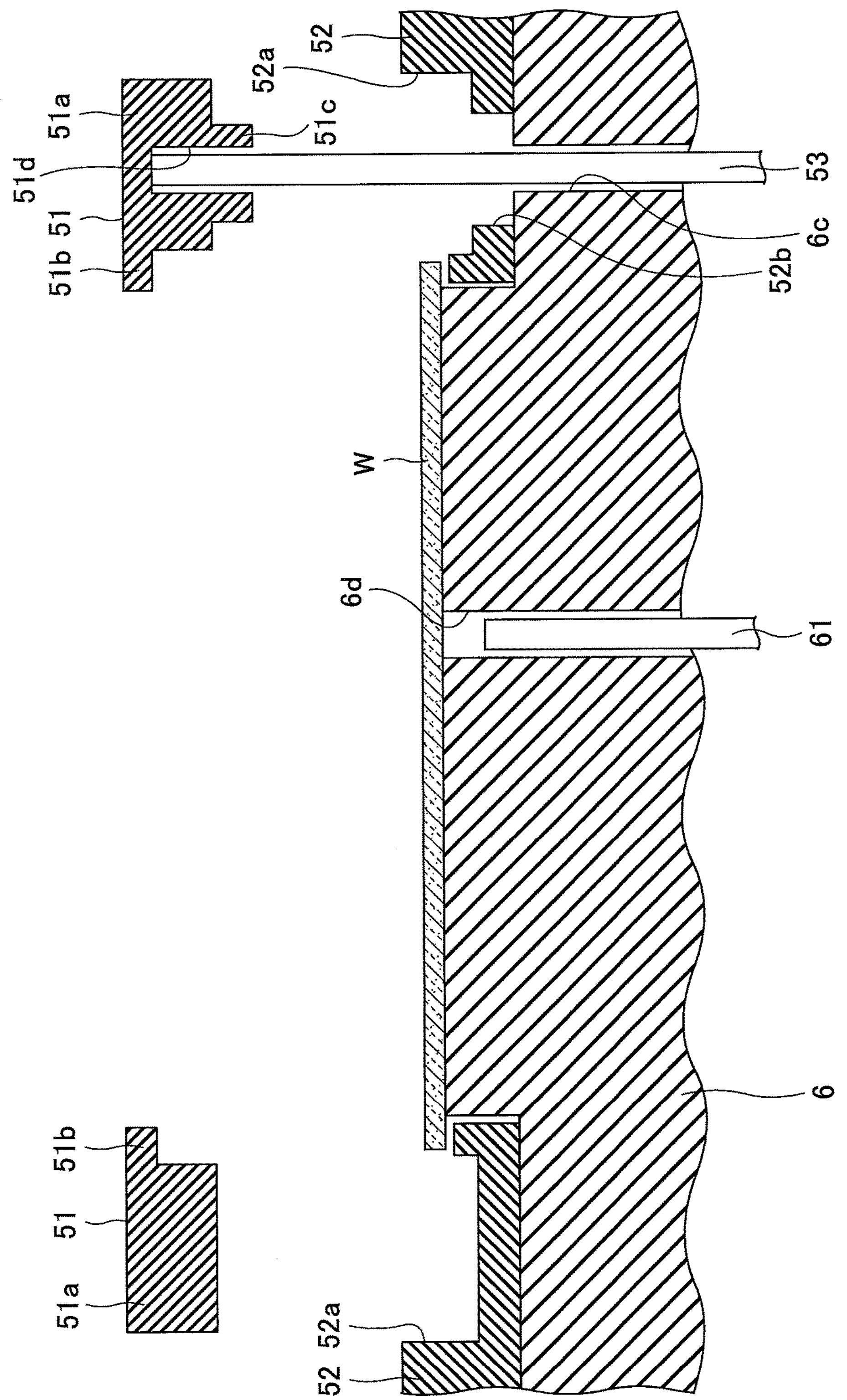
FIG. 6 is a schematic cross-sectional view illustrating a fourth state of the operation for placing the wafer on the electrostatic chuck.

First, the lift pin 53 is raised by the drive mechanism 54 in a state where the wafer W is not held by the electrostatic chuck 6 (see FIG. 3). The raised lift pin 53 pushes the upper ring member 51 upward to raise the upper ring member 51 (see FIG. 4).

Next, the gate valve 85 is opened, and the wafer W having a resist pattern formed thereon is transferred by a transfer robot (not shown), for example, to be delivered onto the electrostatic chuck 6 within the processing chamber 1 from the loading/unloading port 84 via a load lock chamber (not shown). Then, the lift pin 61 is raised by the drive mechanism 62, and the wafer W is received by the raised lift pin 61 from the transfer robot (see FIG. 5).

Next, the transfer robot is evacuated out of the processing chamber 1, and the gate valve 85 is closed. Then, the lift pin 61 is lowered by the drive mechanism 62, and the wafer W is placed on the electrostatic chuck 6 (see FIG. 6). Further, a predetermined DC voltage from the DC power supply 12 is applied to the electrode 6*a* of the electrostatic chuck 6, and as a result the wafer W is electrostatically attracted to the electrostatic chuck 6 by the Coulomb force that is generated between the wafer W and the electrostatic chuck 6.

Next, as the lift pin 53 is lowered by the drive mechanism 54, the upper ring member 51 is lowered to its original position to be accommodated within a ring-shaped groove 52*a*. At this point, the wafer W and the bevel cover ring 5 may be in their respective positions illustrated in FIG. 2. In this way, the outer edge portion WE of the wafer W may be covered by the brim part 51*b* of the upper ring member 51.

Note that in the example described above, the wafer W is electrostatically attracted to the electrostatic chuck 6 before the upper ring member 51 is lowered. However, the electrostatic attraction of the wafer W to the electrostatic chuck 6 may alternatively be performed after lowering the upper ring member 51, for example.

Figure 7:
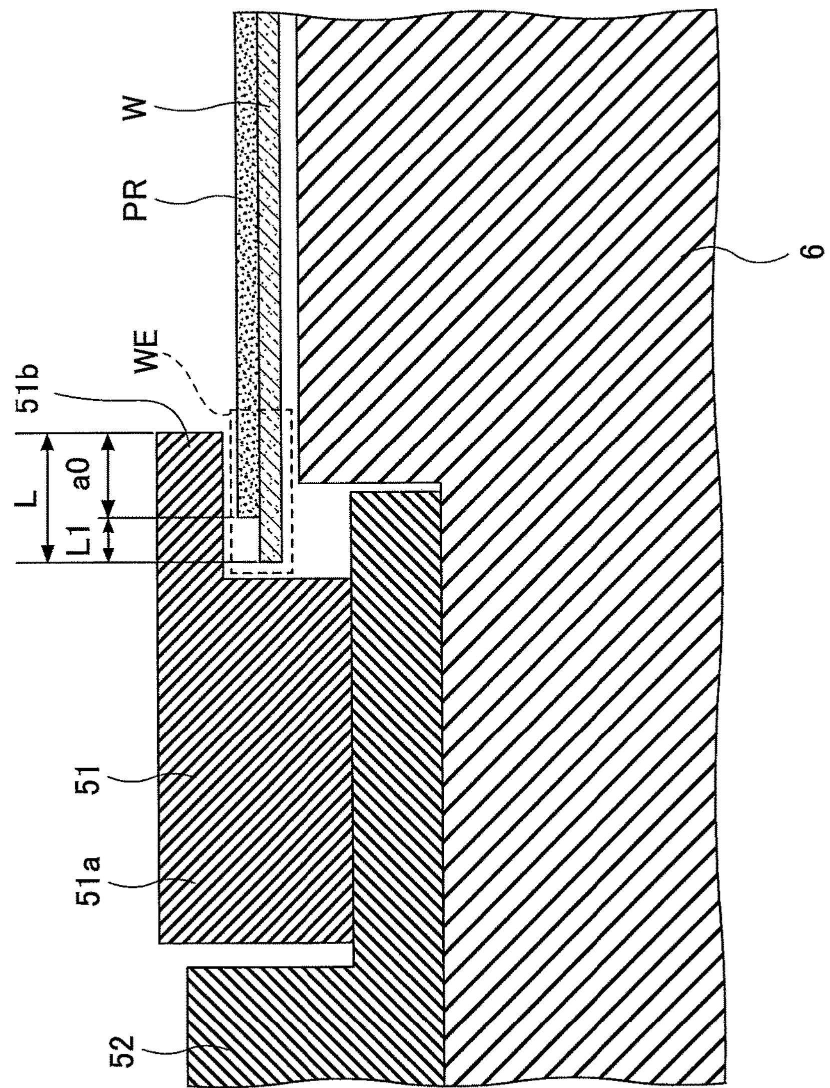
FIG. 7 is an enlarged cross-sectional view illustrating the wafer being supported by the electrostatic chuck while having an outer edge portion covered by a brim part of an upper ring member.

FIG. 7 is an enlarged cross-sectional view of the wafer W having its outer edge portion WE covered by the brim part 51*b* of the upper ring member 51 and being supported by the electrostatic chuck 6 in such a state.

As illustrated in FIG. 7, the upper ring member 51 covers a region of the outer edge portion WE of the wafer W extending over a predetermined width L from the outer edge of the wafer W. Also, a resist pattern (resist PR) is formed on the surface of the wafer W. The resist PR is removed from a region of the outer edge portion WE of the wafer W extending over a predetermined width L1 from the outer edge of the wafer W so that the substrate surface of the waver W is exposed at this region. As indicated in formula (1) shown below, the predetermined width L is preferably greater than the predetermined width L1.

$$L>L1 \quad (1)$$

The predetermined width L1 is an example of a first predetermined width that satisfies formula (1).

Assuming an inner diameter of the upper ring member 51 is denoted as DI, and an outer diameter of the wafer W is denoted as DO (see FIG. 2), the relationship between DI, DO, and L may satisfy the following formula (2).

$$L=(DO-DI)/2 \quad (2)$$

Based on the above formulas (1) and (2), the relationship between DI, DO, and L1 preferably satisfies the following formula (3).

$$DI<DO-2L1 \quad (3)$$

That is, the inner diameter DI of the brim part 51*b* of the upper ring member 51 is preferably determined based on the outer diameter DO of the wafer W and the predetermined width L1.

Next, air is discharged from the processing chamber 1 via the exhaust port 81 by the vacuum pump of the exhaust device 83. Then, a processing gas for etching is introduced into the processing chamber 1 to generate plasma for etching the wafer W.

The etching process involves introducing a predetermined processing gas (etching gas) into the processing chamber 1 from the first processing gas supply source 14 in a state where the processing chamber 1 is depressurized to a predetermined degree of vacuum and maintained at a predetermined pressure. In the case of etching silicon Si as the base material of the wafer W using a resist pattern as a mask, the so-called halogen gas such as $Cl_2$, $Cl_2$+HBr, $Cl_2+O_2$, $CF_4+O_2$, $SF_6$, $Cl_2+N_2$, $Cl_2$+HCl, or HBr+$Cl_2+SF_6$ may be used as the predetermined processing gas, for example. Alternatively, in a case where one or more layers of a hard mask film made of $SiO_2$ or SiN, for example, is formed on the surface of the wafer W, and the resist pattern is used as a mask to etch such hard mask film, a mixed gas including CF gas (e.g., $CF_4$, $C_4F_8$, $CHF_3$, $CH_3F$, $CH_2F_2$) and Ar gas, or a gas having oxygen added to such mixed gas may be used as the predetermined processing gas, for example. In a state where such a predetermined processing gas is introduced into the processing chamber 1, a high frequency power of 100 MHz, for example, is supplied to the stage 2 from the first RF power supply 10*a*. Also, a high frequency power (for biasing) of 13.56 MHz, for example, is supplied to the stage 2 from the second RF power supply 10*b* to prompt ion attraction.

When the high frequency powers are applied to the stage 2 corresponding to the lower electrode, an electric field is formed between the shower head 16 corresponding to the upper electrode and the stage 2 corresponding to the lower electrode. Electrical discharge occurs within the processing chamber 1 that accommodates the wafer W, and this electrical discharge prompts the generation of plasma from the processing gas. Anisotropic etching is performed on the wafer W by the generated plasma using the resist pattern famed on the surface of the wafer W as a mask while the outer edge portion WE of the wafer W is covered by the upper ring member 51.

After the etching process is completed, an ashing process is performed to remove the remaining resist from the wafer W. The ashing process is performed using plasma generated from a processing gas for ashing.

The ashing process involves introducing a predetermined processing gas (ashing gas) into the processing chamber 1 from the second processing gas supply source 15 in a state where the processing chamber 1 is depressurized to a predetermined degree of vacuum and maintained at a predetermined pressure. For example, $O_2$ gas, NO gas, $N_2O$ gas, $H_2O$ gas, or $O_3$ gas may be used as the predetermined processing gas for ashing. In a state where such a predetermined processing gas is introduced into the processing chamber 1, a high frequency power of 100 MHz, for example, is supplied to the stage 2 from the first RF power supply 10*a*. Also, a high frequency power (for biasing) of 13.56 MHz, for example, is supplied to the stage 2 from the second RF power supply 10*b* to prompt ion attraction.

When the high frequency powers are applied to the stage 2 corresponding to the lower electrode, an electric field is formed between the shower head 16 corresponding to the upper electrode and the stage 2 corresponding to the lower electrode. Electrical discharge occurs within the processing chamber 1 that accommodates the wafer W, and this electrical discharge prompts the generation of plasma from the processing gas. The resist remaining on the surface of the wafer W is removed by the generated plasma while the outer edge portion WE of the wafer W is covered by the upper ring member 51.

After the etching process and the ashing process are performed in the manner described above, the application of high frequency power, the application of the DC voltage, and the supply of processing gas are stopped. Then, the wafer W is transferred outside the processing chamber 1 by performing the wafer transfer operations described above in reverse order.

According to an aspect of the present embodiment, surface roughening of the substrate surface of the wafer W at its outer edge portion WE may be prevented when etching the wafer W having a resist pattern formed thereon. In the following, such an aspect of the present embodiment is described in connection with a comparison example.

Figure 8:
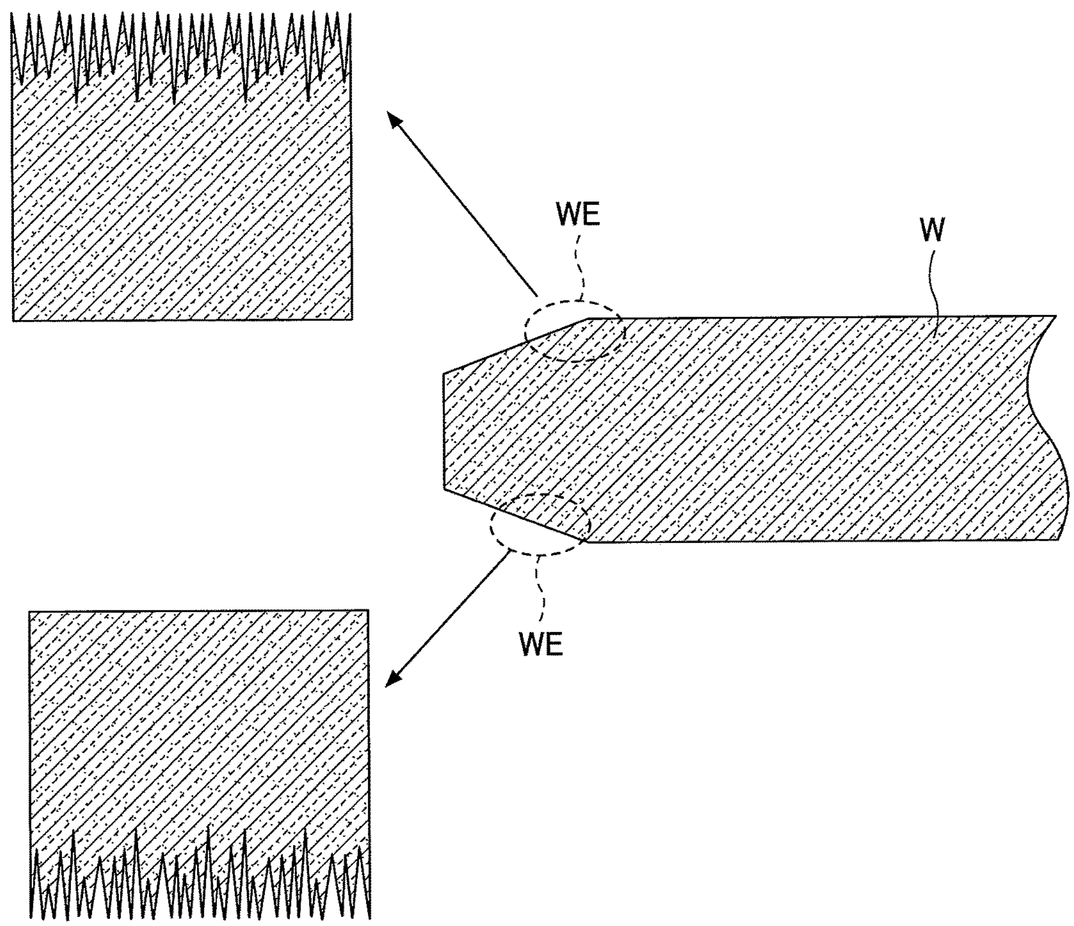
FIG. 8 is a cross-sectional view illustrating surface roughening of a substrate surface of the wafer at its outer edge portion that may occur in a case where the outer edge portion is not covered by the upper ring member.

As a comparison example, a case where the outer edge portion WE of the wafer W is not covered by the upper ring member 51 is contemplated below. In this case, the outer edge portion WE of the wafer W is exposed and comes into contact with plasma. As described above, the resist PR is removed from the region of the outer edge portion WE of the wafer extending over the predetermined width L1 from the outer edge of the wafer W so that the substrate surface of the wafer W is exposed at this region. As illustrated in FIG. 8, when the exposed substrate surface of the wafer W comes into contact with plasma, the so-called black silicon (roughened silicon) is formed at the exposed substrate surface at the outer edge portion WE of the wafer W.

On the other hand, as described above, in the present embodiment, the region of the outer edge portion WE of the wafer W extending over the predetermined width L from the outer edge of the wafer W is covered by the upper ring member 51. In this way, plasma may be prevented from coming around the outer edge portion WE of the wafer W while an etching process is performed on the wafer W. That is, the region of the outer edge portion WE of the wafer W extending over the predetermined width L1 from the outer edge of the wafer W where the substrate surface of the wafer W is exposed may be covered so that it would not be exposed to plasma. In this way, the substrate surface of the wafer W at the outer edge portion WE of the wafer W may be prevented from roughening. In other words, the outer edge portion WE of the wafer W may be protected.

Also, according to an aspect of the present embodiment, when etching the wafer W having a resist pattern formed thereon to create a via hole V, an inclination of the via hole V by a certain inclination angle with respect to the vertical direction may be suppressed for via holes V formed near the outer edge portion WE of the wafer W. In the following, such an aspect of the present embodiment is described.

Figure 9:
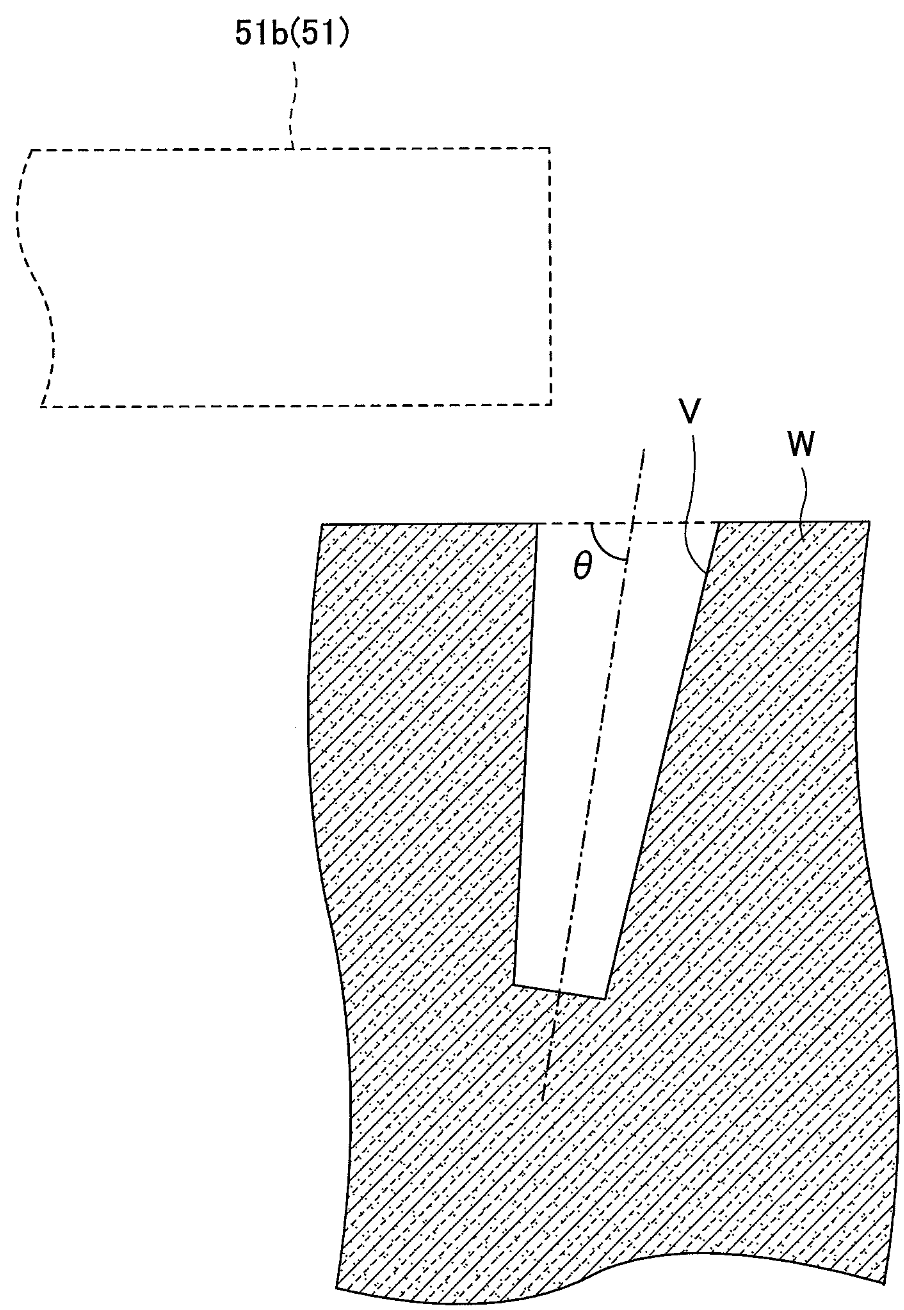
FIG. 9 is a cross-sectional view illustrating an inclination of a via hole formed within the wafer.

When the outer edge portion WE of the wafer W is covered by the upper ring member 51, a via hole V formed at the wafer W near the brim part 51*b* of the upper ring member 51 may be prone to inclination. That is, as illustrated in FIG. 9, a central axis of the via hole V tends to incline at an inclination angle of (90−θ) with respect to the vertical direction, assuming θ represents an angle of the central axis with respect to the horizontal direction. It is speculated that while the brim part 51*b* prevents plasma from coming around the outer edge portion WE of the wafer W, it also causes an inclination of the irradiation direction of plasma.

Figure 10:
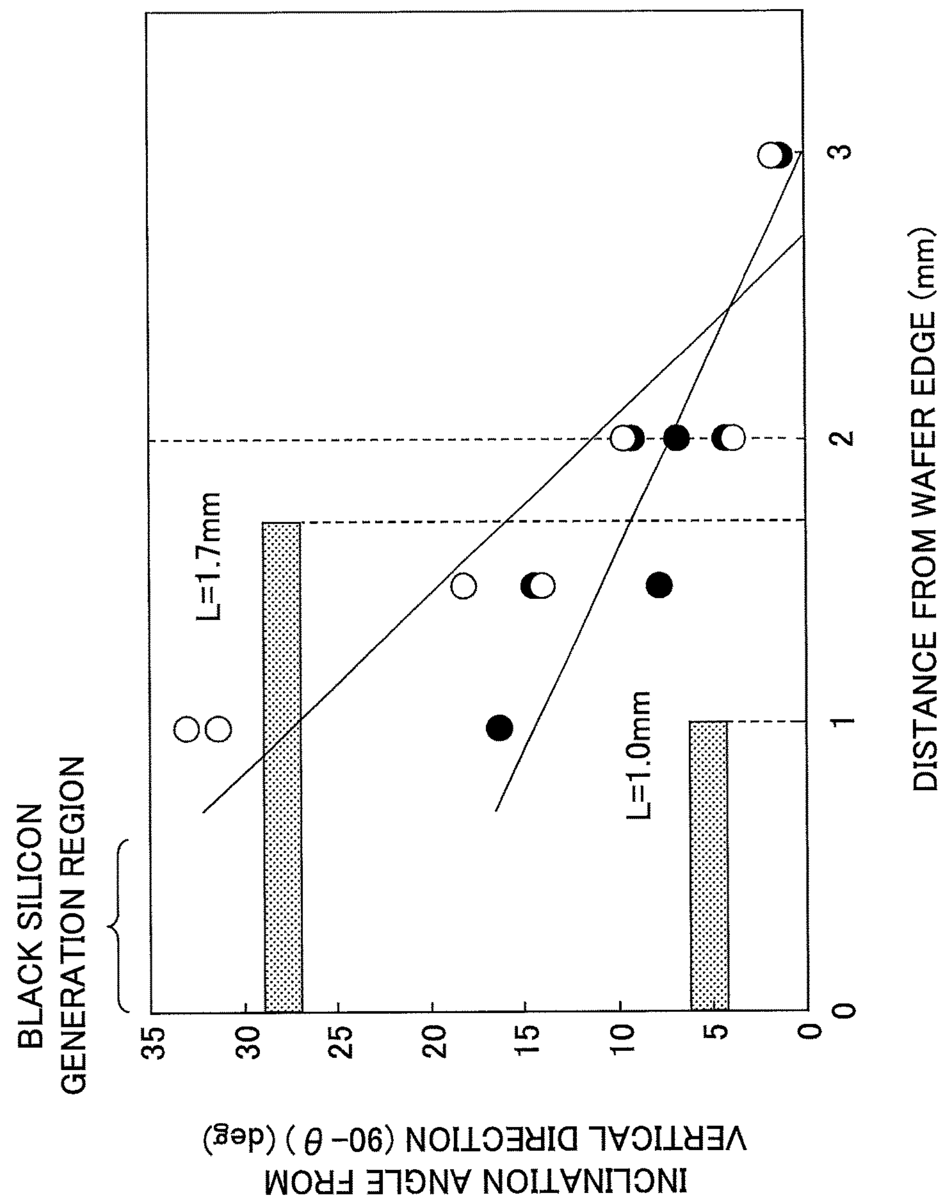
FIG. 10 is a graph indicating measurement results of inclination angles with respect to the vertical direction of via holes formed at various distances from the outer edge of the wafer.

FIG. 10 is a graph illustrating inclination angles (90−θ) of the central axes of via holes V that are etched at various distances from the outer edge of the wafer W in an exemplary case where DO=300 mm, L=1.7 mm (DI=296.6 mm), or L=1.0 mm (DI=298 mm). In the graph of FIG. 10, black circles represent the case where L=1.0 mm, and white circles represent the case where L=1.7 mm. Also, in FIG. 10, (90−θ)=0 represents a case where the central axis of the via hole V is not inclined at all with respect to the vertical direction, and the greater the value of the inclination angle (90−θ), the greater the inclination of the central axis with respect to the vertical direction.

Whether L=1.7 mm or L=1.0 mm, the inclination angle (90−θ) of a via hole V that is formed at a point that is relatively far away from the edge of the wafer W; namely, a point towards the center of the wafer W, is substantially equal to 0 (zero). That is, the via hole V formed at such a point extends substantially in the vertical direction without inclining. On the other hand, whether L=1.7 mm or L=1.0 mm, the inclination angle (90−θ) of the via hole V is greater at a point where the distance from the edge of the wafer W is shorter; namely, a point toward the outer edge portion WE of the wafer W. That is, the inclination angle (90−θ) of the via hole V increases as the via hole V comes closer to the edge of the brim part 51*b* of the upper ring member 51.

In comparing the case where L=1.0 mm with the case where L=1.7 mm, when the distance from the outer edge of the wafer W is the same, the inclination angle (90−θ) is smaller when L=1.0 mm. That is, the inclination angle (90−θ) of the via hole V with respect to the vertical direction becomes smaller as the value of the predetermined width L becomes smaller. In other words, based on the above formula (2), this means that the inclination angle (90−θ) of the via hole V with respect to the vertical direction becomes smaller as the inner diameter DI of the brim part 51*b* of the upper ring member 51 becomes larger.

Assuming the positioning accuracy of the relative position of the wafer W with respect to the upper ring member 51 is denoted as ±a0, the positioning accuracy of the wafer W attributed to the transfer system for transferring the wafer W such as the transfer robot and the lift pin 61 is denoted as ±a1, and the positioning accuracy of the bevel cover ring 5 attributed to the shape accuracy of the lift pin 53 or the bevel cover ring 5 is denoted as ±a2, the relationship between a0, a1, and a2 may be expressed by the following formula (4).

$$a0=a1+a2 \quad (4)$$

That is, the absolute value a0 of the positioning accuracy of the relative position of the wafer W with respect to the upper ring member 51 ±a0 is equal to the sum of the absolute value a1 of the positioning accuracy of the wafer W and the absolute value a2 of the positioning accuracy of the bevel cover ring 5.

The predetermined width L is preferably designed to be a suitable value such that the actual width of the covered region of the wafer W would not be less than the predetermined width L1 even when the actual width varies from the designed value due to the positioning accuracy (±a0). If the predetermined width L is smaller than the predetermined width L1, the region of the outer edge portion WE of the wafer W that has the resist removed and the substrate surface of the wafer W exposed would come into contact with plasma. Accordingly, when the predetermined width L subject to variations attributed to the positioning accuracy has a range of (L±a0), the minimum value (L−a0) of the predetermined width L may be set equal to the predetermined width L1, for example. In this way, the outer edge portion WE of the wafer W may be protected from surface roughening while minimizing the inclination angle (90−θ) with respect to the vertical direction of a via hole V formed near the outer edge portion WE of the wafer W.

FIG. 7 illustrates an exemplary case where the predetermined width L1 is set equal to the minimum value (L−a0) of the predetermined width L subject to variations attributed to the positioning accuracy (±a0).

In another example, the minimum value (L−a0) of the predetermined width L subject to variations attributed to positioning accuracy (±a0) may be set equal to the sum of the predetermined width L1 plus a margin α (L1+α). In this case, the relationship between L and L1 may be expressed by the following formula (5).

$$L=L1+(a0+\alpha) \quad (5)$$

That is, the predetermined width L may be set equal to the sum of the predetermined width L1 and a predetermined width (a0+α) that depends on the positioning accuracy a0 of the relative position of the wafer W with respect to the upper ring member 51. Based on the above formulas (2) and (5), the relationship between DI and DO preferably satisfies the following formula (6).

$$DI=DO-2(L1+a0+\alpha) \quad (6)$$

That is, the inner diameter DI of the brim part 51*b* of the upper ring member 51 is preferably determined based on the outer diameter DO of the wafer W, the predetermined width L1, and the predetermined width (a0+α) that depends on the positioning accuracy a0. In this way, the outer edge portion WE of the wafer W may be protected from surface roughening while minimizing the inclination angle (90−θ) with respect to the vertical direction of a via hole V formed near the outer edge portion WE. Note that the predetermined width (a0+α) is an example of a second predetermined width that depends on the positioning accuracy of the relative position of the substrate with respect to the cover member.

FIG. 16 is a table indicating measurement results of the angle θ with respect to the horizontal direction of via holes V formed at different distances from the center of the wafer W for three different examples; namely, a first example where L=1.7 mm (DI=296.6) and the upper ring member 51 is made of quartz, a second example where L=1.7 mm (DI=296.6) and the upper ring member 51 is made of yttria ($Y_2O_3$), and a third example where L=1.0 mm (DI=298) and the upper ring member 51 is made of yttria ($Y_2O_3$).

Comparing the measurement results of the first and second examples of FIG. 16, in the case where the upper ring member 51 is made of yttrium ($Y_2O_3$) and has the same inner diameter (DI=296.6) as that of the upper ring member 51 made of quartz, the measurement results of the angle θ are substantially the same as the case where the upper ring member 51 is made of quartz. That is, the angle θ is substantially close to 90 degrees in both cases. Considering the superior plasma resistance characteristics of yttria compared to quartz, yttria may preferably be used as the material for the upper ring member 51 so that the life of the upper ring member 51 may be prolonged in addition to providing protection of the outer edge portion WE of the wafer W.

Next, comparing the measurement results of the second and third examples of FIG. 16, in the case where the upper ring member 51 is made of yttria ($Y_2O_3$) and the inner diameter of the upper ring member 51 is varied (DI=296.6 or DI=298), the angle θ may be closer to 90 degrees when the inner diameter DI of the upper ring member 51 is greater. That is, the greater the inner diameter DI of the upper ring member 51, the smaller the inclination angle of the via hole V with respect to the vertical direction.

According to another aspect of the present embodiment, when ashing the resist remaining on the etched wafer W, the ashing rate at the outer edge portion WE of the wafer W may be prevented from decreasing. In the following, such as aspect of the present embodiment is described.

Figure 11:
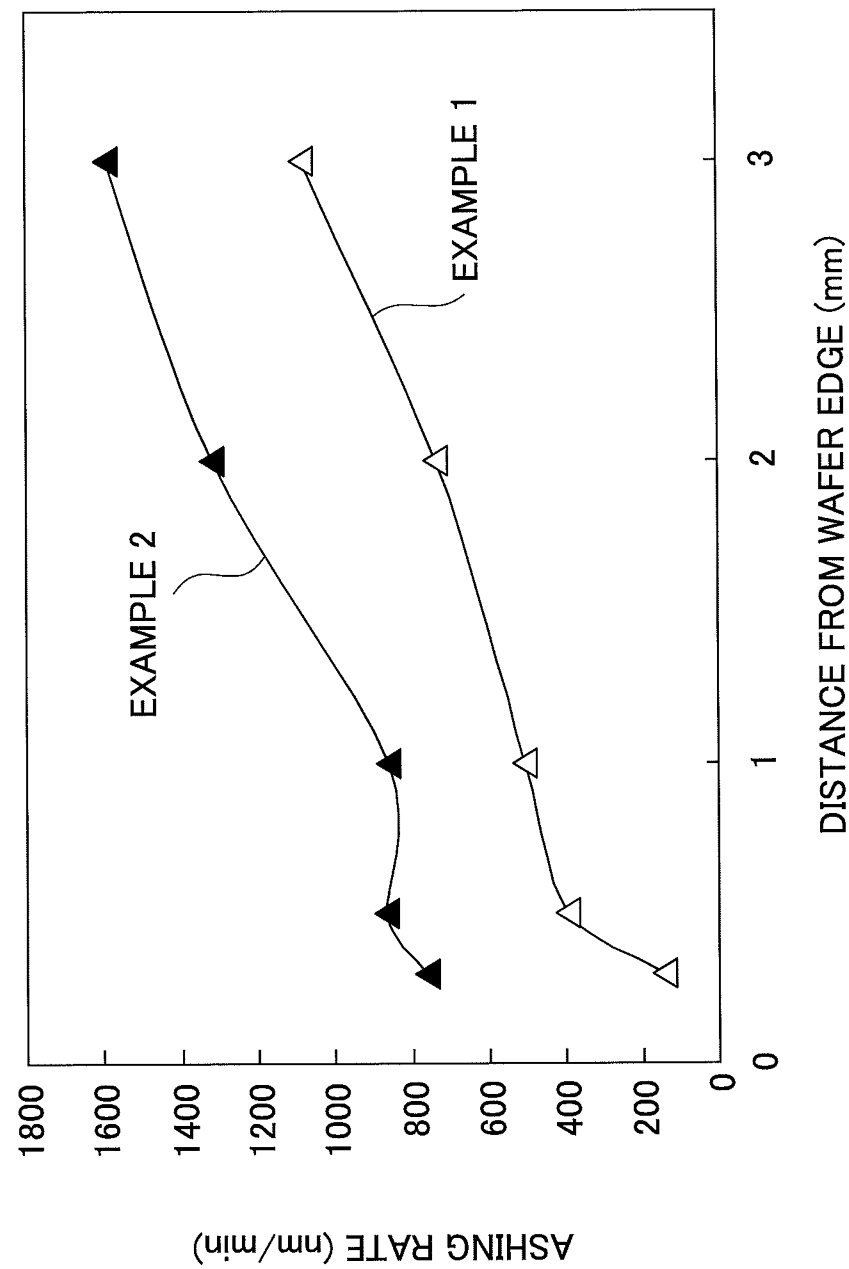
FIG. 11 is a graph indicating measurement results of resist ashing rates at various points on the wafer at various distances from the outer edge of the wafer in two different examples using different ashing conditions.

FIG. 11 is a graph indicating measurement results of resist ashing rates measured at various distances from the outer edge of the wafer W in Example 1 and Example 2 that perform ashing processes under different ashing conditions. The ashing conditions used in Example 1 and Example 2 are as follows:

Example 1

Pressure within film formation apparatus:

300 mTorr

High frequency power supply power (upper electrode/lower electrode):

0/1500 W

Processing gas flow rate:

$O_2$=300 sccm

Processing time:

30 seconds

Example 2

Pressure within film formation apparatus:
100 mTorr
High frequency power supply power (upper electrode/lower electrode):
0/2000 W
Processing gas flow rate:
$O_2$=1300 sccm
Processing time:
30 seconds As illustrated in FIG. 11, the ashing rate tends to decrease as the distance from the outer edge of the wafer W becomes smaller; namely, as the ashing position comes closer to the outer edge of the wafer W. This indicates that while plasma may be prevented from coming around the outer edge portion WE of the wafer W by arranging the upper ring member 51, such an arrangement may cause the ashing rate to decrease near the upper ring member 51. In Example 1, the ratio of the ashing rate at a position 0.3 mm from the wafer edge with respect to the ashing rate at a position 3 mm from the wafer edge is approximately 10%.

In Example 2, the overall ashing rate is increased compared to Example 1. Also, the ratio of the ashing rate at a position 0.3 mm from the wafer edge with respect to the ashing rate at a position 3 mm from the wafer edge is increased to approximately 50%. As can be appreciated, by optimizing the processing conditions of the ashing process, a decrease in the ashing rate at the outer edge portion WE of the wafer W that is covered by the upper ring member 51 may be suppressed.

Figure 12:
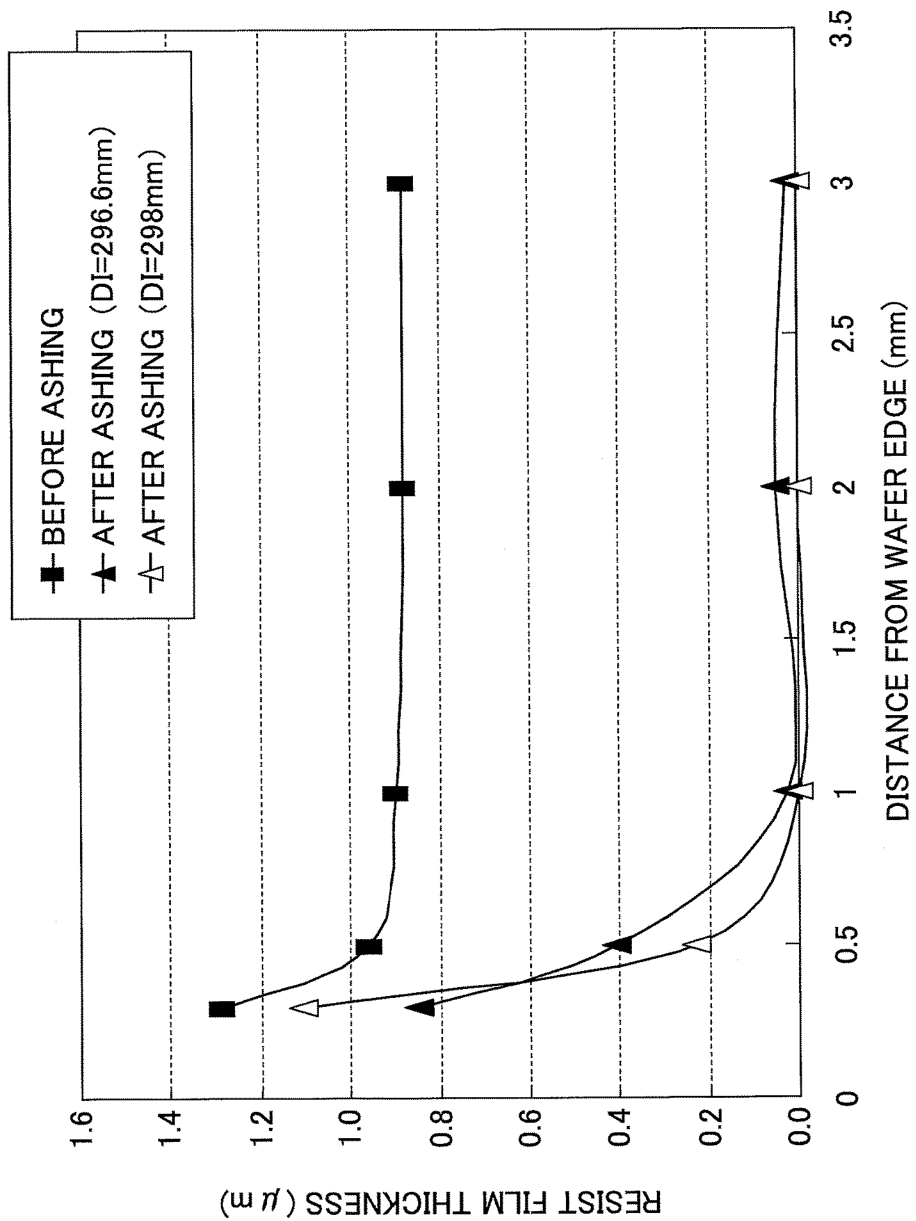
FIG. 12 is a graph indicating measurement results of resist film thicknesses before and after ashing at various points on the wafer at various distances from the outer edge of the wafer.

FIG. 12 is a graph indicating measurement results of resist film thicknesses before and after ashing measured at various distances from the outer edge of the wafer W in cases where the inner diameter DI of the upper ring member 51 is 296.6 mm and 298 mm (DI=296.6 mm and DI=298 mm). Note that in the example illustrated in FIG. 12, the resist film thickness before ashing is assumed to be the same regardless of the value of the inner diameter DI of the upper ring member 51.

At a position 0.5 mm from the edge of the wafer W, the resist film thickness after ashing in the case where DI=298 mm is less than the resist film thickness after ashing in the case where DI=296.6 mm. That is, by increasing the inner diameter DI of the upper ring member 51, a decrease in the ashing rate at the outer edge portion WE of the wafer W that is covered by the upper ring member 51 may be suppressed.

Second Embodiment

In the following, a plasma etching method according to a second embodiment of the present invention is described.

The plasma etching method according to the second embodiment may be implemented using a plasma etching apparatus similar to the plasma etching apparatus used in the first embodiment. Accordingly, descriptions of the plasma etching apparatus used in the second embodiment are omitted.

The plasma etching method according to the present embodiment is for forming a via hole through a wafer using the so-called TSV (Through-Silicon Via) technology to form a via electrode within a three-dimensionally stacked semiconductor device. That is, the plasma etching method according to the present embodiment differs from that of the first embodiment in that it involves etching a bonded wafer that includes a wafer on which a via hole is formed (also referred to as "device wafer") and a support wafer to which the device wafer is bonded via an adhesive.

Figure 13:
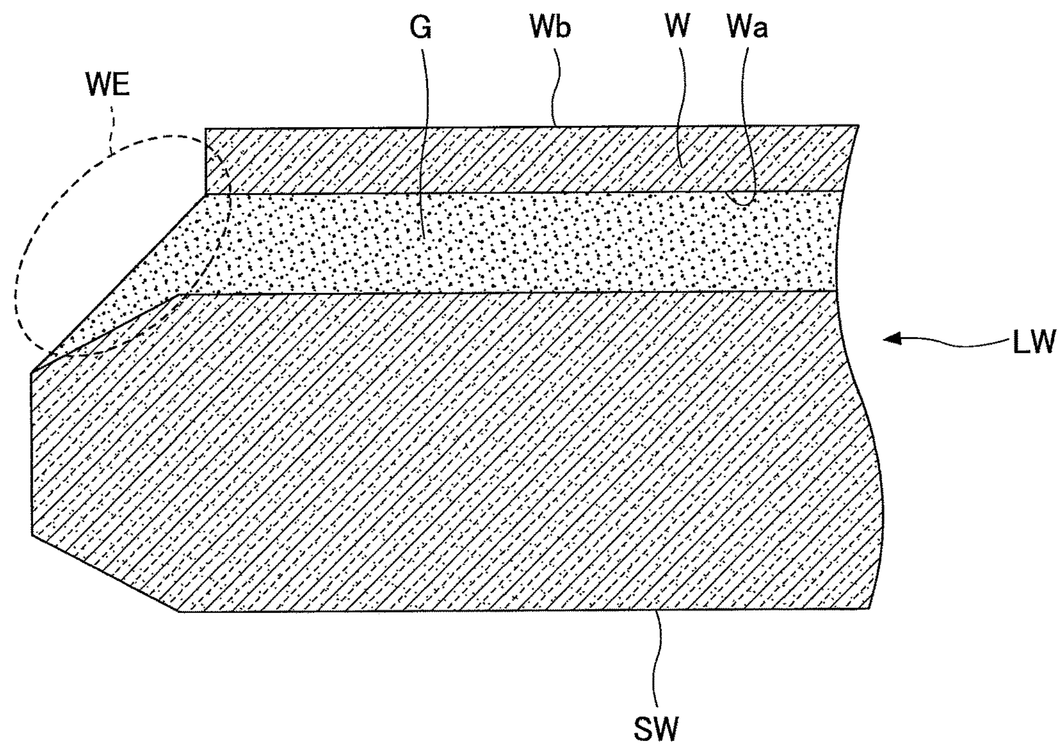
FIG. 13 is a schematic cross-sectional view illustrating a configuration of a bonded wafer.
Figure 14A:
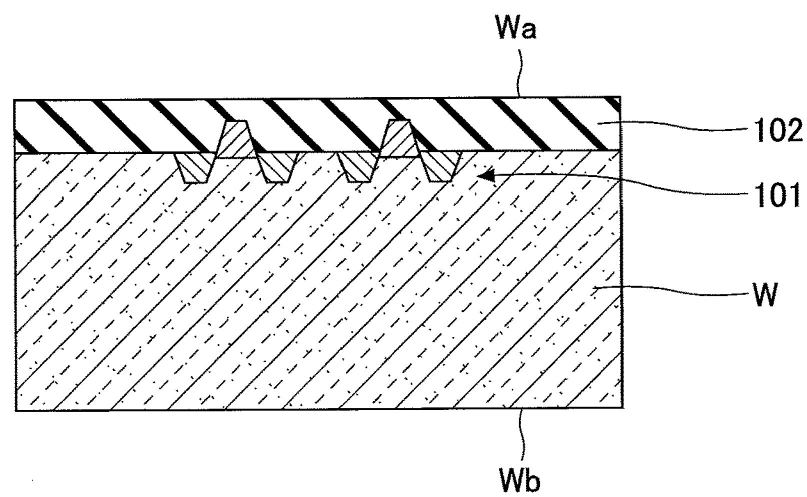
FIG. 14A is a schematic cross-sectional view illustrating a first state of a wafer in a process step of a semiconductor device manufacturing method including a plasma etching method according to a second embodiment of the present invention.
Figure 14B:
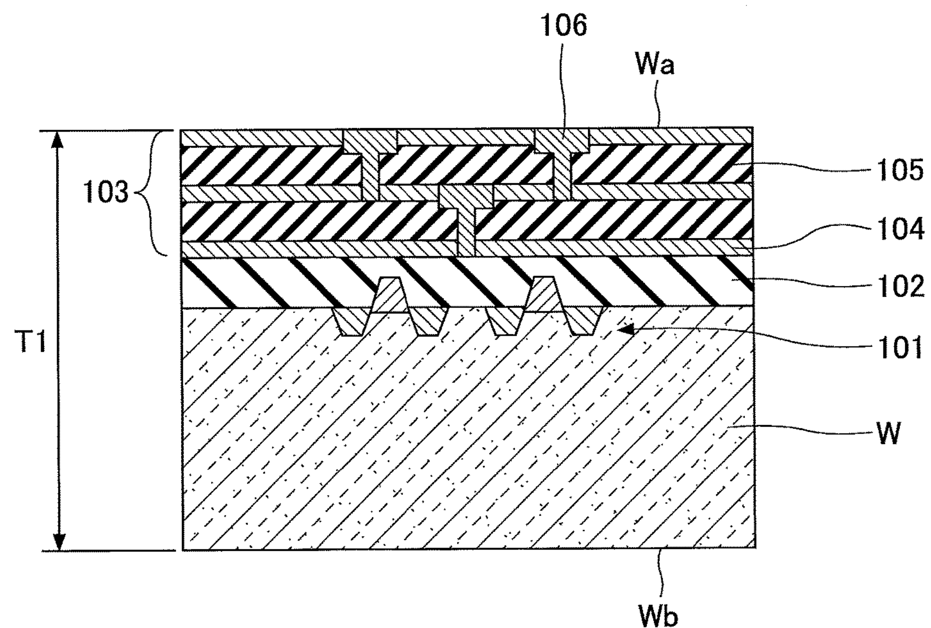
FIG. 14B is a schematic cross-sectional view illustrating a second state of the wafer in a process step of the semiconductor device manufacturing method including the plasma etching method according to the second embodiment.
Figure 14C:
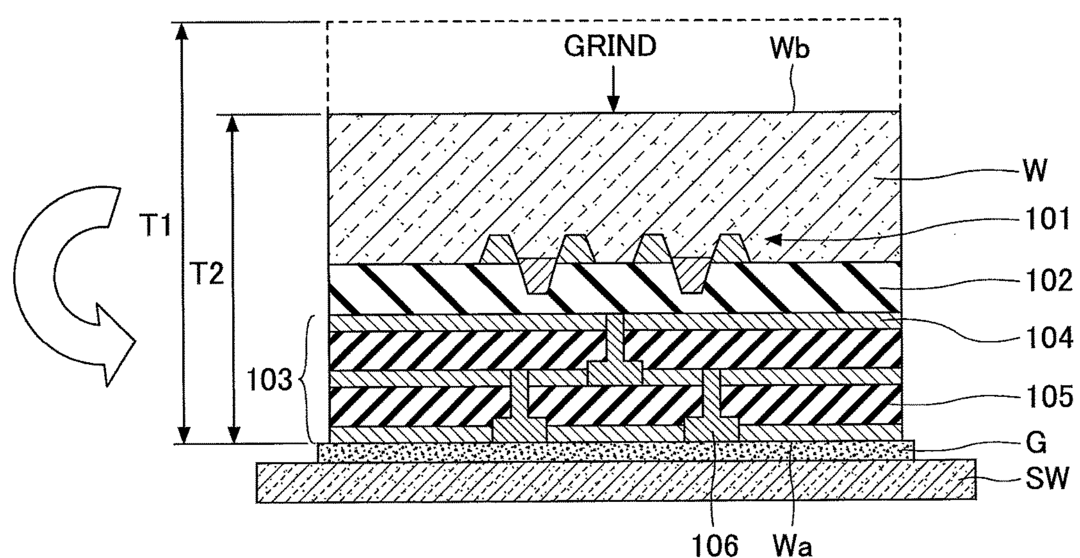
FIG. 14C is a schematic cross-sectional view illustrating a third state of the wafer in a process step of the semiconductor device manufacturing method including the plasma etching method according to the second embodiment.

FIG. 13 is a schematic cross-sectional view illustrating an exemplary configuration of a bonded wafer LW.

The bonded wafer LW includes a device wafer W and a support wafer SW. The device wafer W is a substrate having a semiconductor device such as a transistor formed on its surface Wa. The support wafer SW is a support substrate for reinforcing the device wafer W when the device wafer W is thinned by a grinding process that is performed on its rear surface Wb. The device wafer W is bonded to the support wafer SW via an adhesive G.

FIGS. 14A-15C are schematic cross-sectional views illustrating states of the wafer W at various process steps of a semiconductor device manufacturing method including the plasma etching method of the present embodiment.

First, a transistor 101 is formed on the surface of the device wafer W, which may be a silicon wafer, for example. Then, an interlayer insulating film 102 is formed on the device W having the transistor 101 formed thereon (see FIG. 14A).

Next, a wiring structure 103 is formed on the interlayer insulating film 102. The wiring structure 103 is formed on the interlayer insulating film 102 by alternately layering a wiring layer 104 and an insulating film 105 and forming a via hole 106, which penetrates through the insulating film 105 and establishes electrical connection between the wiring layers 104 arranged above and below the insulating film 105 (see FIG. 14B).

Next, the device wafer W is turned upside down and is bonded to the support wafer SW via an adhesive G to prepare the bonded wafer LW. The support wafer SW may be a silicon wafer, for example. The support wafer SW acts as a support substrate that reinforces the device wafer W and prevents the device wafer W from warping when the device wafer W is reduced in thickness by a grinding process that is performed on its rear surface Wb. The bonded wafer LW is placed on a support member of a grinding apparatus, for example, and the rear surface Wb of the device wafer W is subject to a grinding process so that the device wafer W may be thinned from a thickness T1 before grinding to a predetermined thickness T2 after grinding (see FIG. 14C). The predetermined thickness T2 may be 50-200 μm, for example.

Note that in FIGS. 14A-15C, the interlayer insulating film 102 and the wiring structure 103 are not drawn to scale. That is, for purposes of illustration, the thicknesses of the interlayer insulating film 102 and the wiring structure 103 are magnified. However, in actual applications, the interlayer insulating film 102 and the wiring structure 103 are much thinner than the device wafer W itself.

Also, the adhesive G is exposed at the outer edge portion WE of the bonded wafer LW (see FIG. 13).

Next, a resist is applied on the rear surface Wb of the device wafer W after which the resist is exposed and developed into a resist pattern (not shown). Then, the bonded wafer LW with the device wafer W having the resist pattern formed on its rear surface Wb is subject to an etching process that is similar to that implemented in the plasma etching method according to the first embodiment to form a via hole V. Then, an ashing process similar to that implemented in the plasma etching method of the first embodiment is performed to remove the resist remaining on the rear surface Wb of the bonded wafer LW having the via hole V formed thereon (see FIG. 15A). The diameter of the via hole V may be 1-10 μm, for example. Also, the depth of the via hole V corresponds to the thickness of the thinned device wafer W after its rear surface Wb has undergone the grinding process. As described above, the thickness of the thinned device wafer W may be 50-200 μm, for example.

Figure 15A:
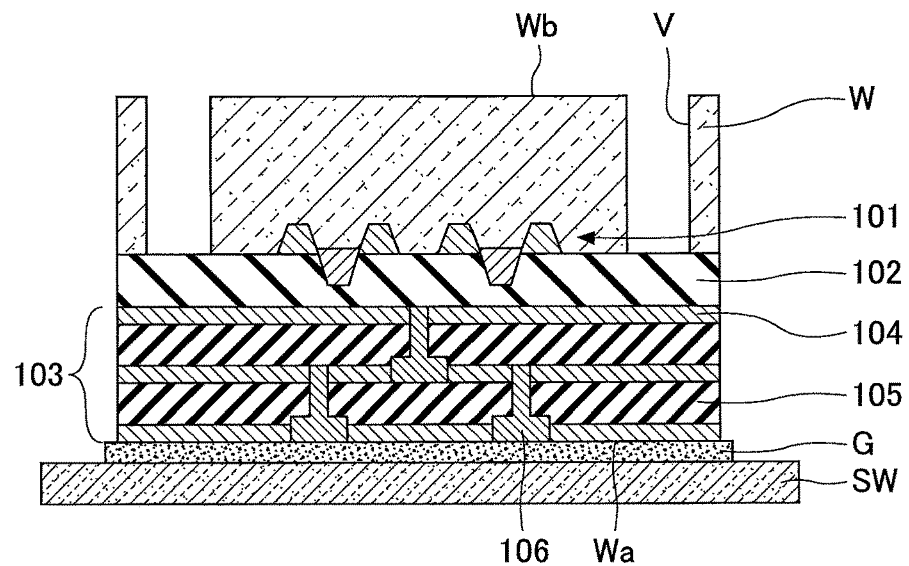
FIG. 15A is a schematic cross-sectional view illustrating a fourth state of the wafer in a process step of the semiconductor device manufacturing method including the plasma etching method according to the second embodiment.
Figure 15B:
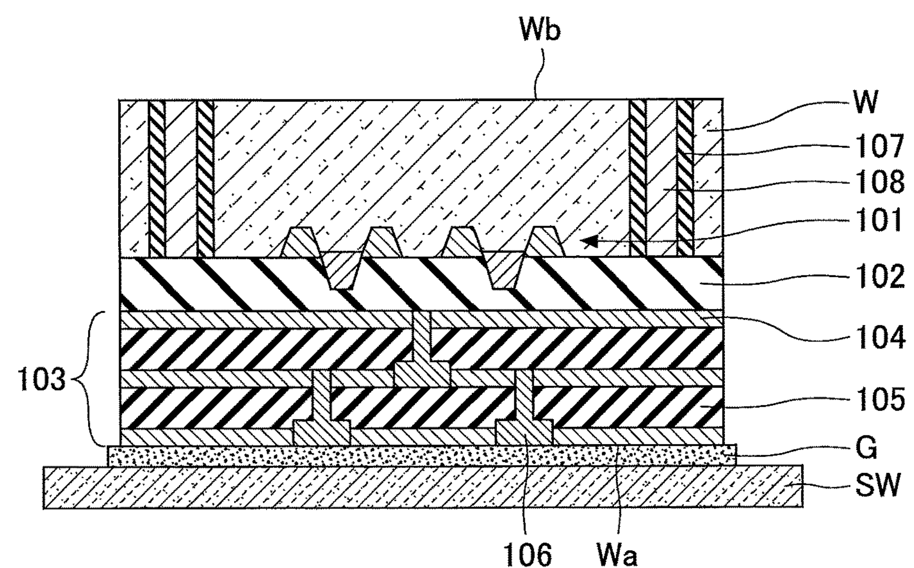
FIG. 15B is a schematic cross-sectional view illustrating a fifth state of the wafer in a process step of the semiconductor device manufacturing method including the plasma etching method according to the second embodiment.
Figure 15C:
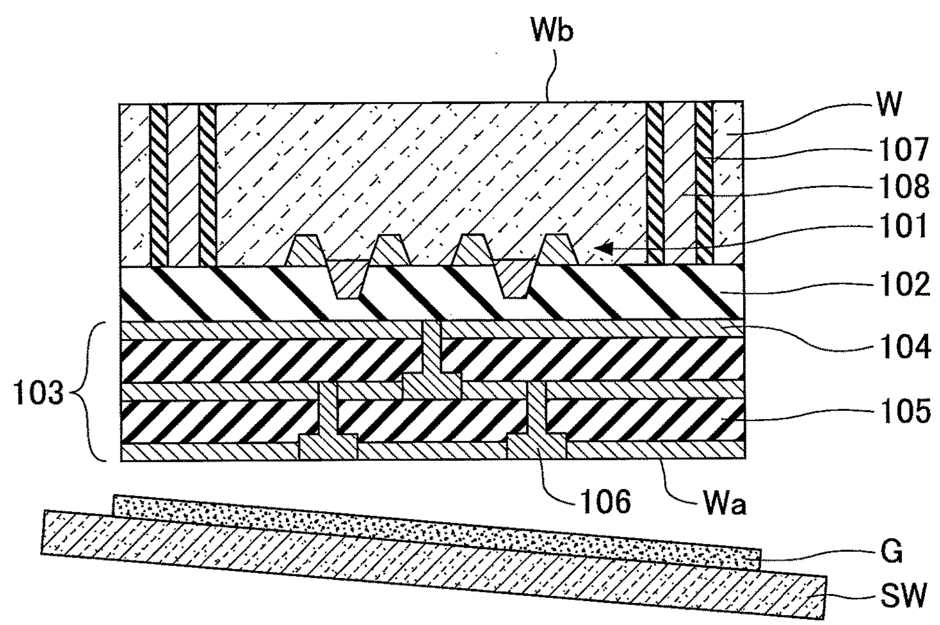
FIG. 15C is a schematic cross-sectional view illustrating a sixth state of the wafer in a process step of the semiconductor device manufacturing method including the plasma etching method according to the second embodiment.

Next, an insulating film 107 made of polyimide, for example, is arranged to cover the inner peripheral face of the via hole V, and a via electrode 108 is formed within the via hole V having its inner peripheral face covered by the insulating film 107 through an electrolytic plating process, for example (see FIG. 15B).

Next, the support wafer SW is separated from the device wafer W, so that the device wafer W that is thinned and has the via electrode 108 formed therein may be obtained. For example, the support wafer SW may be separated from the device wafer W by irradiating ultraviolet (UV) light and weakening the adhesion of the adhesive G (see FIG. 15C).

As with the first embodiment, in the present embodiment, a region of the outer edge portion WE of the bonded wafer LW extending over a predetermined width from the outer edge of the bonded wafer LW is covered by the upper ring member 51. As a result, when the bonded wafer LW is subject to the etching process, plasma may be prevented from coming around the outer edge portion WE of the bonded wafer LW. Thus, the substrate surface of the device wafer W that is exposed at a region of the outer edge portion WE of the bonded wafer LW extending over a predetermined width from the edge of the device wafer W may be prevented from coming into contact with plasma. In this way, surface roughening of the substrate surface of the device wafer W at the outer edge portion WE of the bonded wafer LW may be prevented.

Also, in the present embodiment, the adhesive G is exposed at the outer edge portion WE of the bonded wafer LW between the device wafer W and the support wafer SW. Accordingly, the adhesive G exposed at the outer edge portion WE of the bonded wafer LW may be prevented from coming into contact with plasma. In this way, the adhesive G may be prevented from coming off to generate dust, and the device wafer W and the support wafer SW may be prevented from separating. Further, the outer edge portion WE of the bonded wafer LW may be prevented from becoming brittle and cracking. In other words, the outer edge portion WE of the bonded wafer LW may be protected.

Although certain preferred embodiments of the present invention are described above with reference to the accompanying drawings, the present invention is not limited to these embodiments. That is, additional advantages and modifications will readily occur to those skilled in the art in light of the above disclosures. Therefore, the invention in its broader aspects is not limited to the specific details and representative embodiments shown and described herein. Accordingly, various modifications may be made without departing from the spirit or scope of the general inventive concept as defined by the appended claims and their equivalents.

The present application is based on and claims the benefit of priority of Japanese Patent Application No. 2011-73191 filed on Mar. 29, 2011, the entire contents of which are herein incorporated by reference.

DESCRIPTION OF THE REFERENCE NUMERALS

1 processing chamber 1
2 stage
4 support
5 bevel cover ring
6 electrostatic chuck
16 shower head
51 upper ring member
52 lower ring member
90 control unit

The invention claimed is:

1. A method for plasma etching a bonded substrate on which a wiring structure formed of a first wiring layer above an interlayer insulating film, a second wiring layer below the interlayer insulting film, and a via hole that penetrates through the insulating film and establishes an electrical connection between the first wiring layer and the second wiring layer is formed on a device-bearing surface of a wafer, the bonded substrate including a plurality of substrates bonded together via an adhesive, the bonded substrate having a surface portion, on an opposite side of the wafer from the device-bearing side, on which a resist pattern is formed and an outer edge portion of the bonded substrate where the adhesive is exposed, the plasma etching method comprising:

supporting the bonded substrate on a support part, wherein the device-bearing surface of the wafer faces the support part;

removing the resist pattern from a region that extends a predetermined width from an outer edge of the wafer along the outer edge portion of the bonded substrate;

covering the outer edge portion of the bonded substrate with a cover member configured to prevent plasma from coming around the outer edge portion of the bonded substrate;

generating a first plasma by applying a first high frequency power from a first high frequency power supply and supplying a processing gas for etching from a first processing gas supply source;

etching the bonded substrate using the first plasma; and generating a second plasma by applying a second high frequency power from a second high frequency power supply and supplying a processing gas for ashing from a second processing gas supply source; and ashing the resist pattern etched into the bonded substrate using the second plasma, wherein the cover member includes a first portion that includes an upper brim having an inner diameter DI determined based on the formula DI<DO-2L1, wherein DO is an outer diameter of the bonded substrate having the resist pattern and an exposed surface extending a predetermined width from an outer edge of the bonded substrate, and L1 is the predetermined width of the exposed surface, which is formed on the outer edge portion of the bonded substrate.

2. The plasma etching method according to claim 1, further comprising:

exposing a substrate surface of the bonded substrate at a region that extends a first predetermined width from an outer edge of the bonded substrate, the bonded substrate having a circular plate form, wherein the cover member has a ring-shaped form, and an inner diameter of the cover member is determined based on an outer diameter of the bonded substrate and the first predetermined width.

3. The plasma etching method according to claim 1, further comprising:

covering a top surface of the outer edge portion of the bonded substrate with a first portion of the cover member having an upper brim, and covering a bottom surface of the outer edge portion of the bonded substrate with a second portion of the cover member having a bottom brim, wherein the bottom brim is provided between the support part and the upper brim.

4. The plasma etching method according to claim 3, wherein the first portion is provided above and inside the second portion such that movement of the first portion in a horizontal direction and in a circumferential direction is restricted.

5. The plasma etching method according to claim 3, wherein each of the first and second portions includes a recess, coaxially aligned and configured to receive a lift member, and the method further comprises:

separating the first portion from the second portion using the lift member.

6. The plasma etching method according to claim 1, further comprising:

forming a via hole by etching the outer edge portion of the substrate;

suppressing, with the cover member, an inclination angle of the via hole with respect to a vertical direction when forming the via hole; and preventing, with the cover member, an ashing rate from decreasing when ashing the outer edge portion of the bonded substrate, wherein the first portion of the cover member is made of yttria ($Y_2O_3$), and a covering distance L of the upper brim of the first portion over the outer edge portion is determined by L>L1.

7. The plasma etching method according to claim 3, further comprising:

engaging a corresponding through hole, formed in the second portion, with a protrusion, formed on a bottom surface of the first portion, to contact the support part, thereby restricting movement of the first portion in the horizontal direction and the circumferential direction.

* * * * *